United States Patent [19]
Saeki

[11] Patent Number: 6,075,395
[45] Date of Patent: Jun. 13, 2000

[54] SYNCHRONOUS DELAY CIRCUIT

[75] Inventor: Takanori Saeki, Tokyo, Japan

[73] Assignee: NEC Corporation, Tokyo, Japan

[21] Appl. No.: 09/087,864

[22] Filed: Jun. 1, 1998

[30] Foreign Application Priority Data

May 30, 1997 [JP] Japan ................................. 9-157974

[51] Int. Cl.⁷ ...................................... H03L 7/00
[52] U.S. Cl. ...................... 327/161; 327/166; 327/271; 327/277
[58] Field of Search .................... 327/161, 165, 327/166, 263, 264, 276, 277, 278, 270, 271, 272

[56] References Cited

U.S. PATENT DOCUMENTS

| | | | |
|---|---|---|---|
| 5,287,025 | 2/1994 | Nishimichi | 327/156 |
| 5,699,003 | 12/1997 | Saeki | 327/261 |
| 5,920,222 | 7/1999 | Eustis et al. | 327/269 |

FOREIGN PATENT DOCUMENTS 8-237091  9/1996  Japan .

OTHER PUBLICATIONS

J–Man Han et al., "Skew Minimization Techniques for 256M–bit Synchronous DRAM and Beyond", *1996 Symposium on VLSI Circuits Digest of Technical Papers*, pp. 192–193.

Toshio Yamada et al., "Capacitance coupled Bus with Negative Delay Circuit for High speed and Low Power (10GB/s<500mW) Synchronous DRAMs", *1996 Symposium on VLSI Circuits Digest of Tech. Papers*, pp. 112–113.

Richard B. Watson, Jr. et al., "Clock Buffer Chip with Absolute Delay Regulation Over Process and Environmental Variations", *IEEE 1992 Custom Integrated Circuits Conference*, pp. 25.2.1–25.2.5.

Yoshinori Okajima et al., "Digital Delay Locked Loop and Design Technique for High–Speed Synchronous Interface", *IEICE Trans. Electron.* vol. E79–C, No. 6, Jun. 1996, pp. 798–807.

*Primary Examiner*—Timothy P. Callahan
*Assistant Examiner*—An T. Luu
*Attorney, Agent, or Firm*—Sughrue, Mion, Zinn, Macpeak & Seas, PLLC

[57] ABSTRACT

A synchronous delay circuit contains a first delay circuit for propagating a pulse for a fixed period of time, a second delay circuit for passing the pulse over a length proportional to the length of the first delay circuit along the path that the pulse propagated, and a circuit for outputting a monitor signal when a clock period is propagating through a clock driver. The first delay circuit measures a clock period tCK, and the second delay circuit reconstructs the measured clock period. External clock signals travel through a path from an input buffer through a first switch of a clock driver. The time corresponding to a delay time of the input buffer (td1) and a delay time of the clock divider (td2) is subtracted from the clock period tCK producing a delay circuit with a delay of tCK–(td1+td2). When the clock pulse passes through the delay circuit whose delay is tCK–(td1+td2), the internal clock delay becomes equal to the clock cycle tCK. Thus, the internal clock is free of clock skew.

34 Claims, 33 Drawing Sheets

FIG. 5
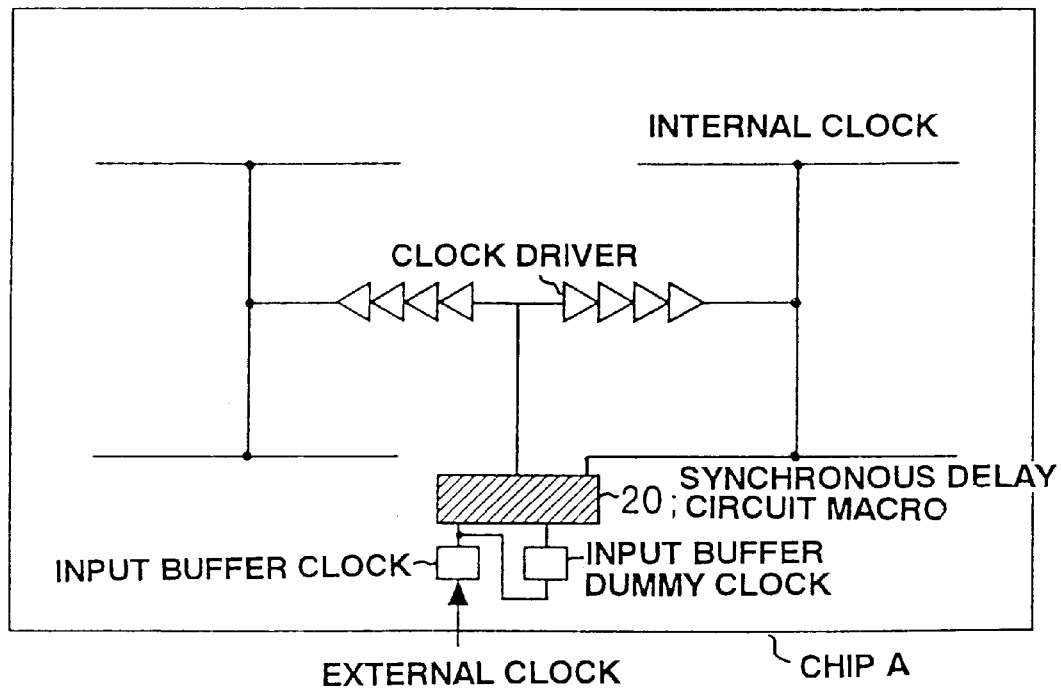
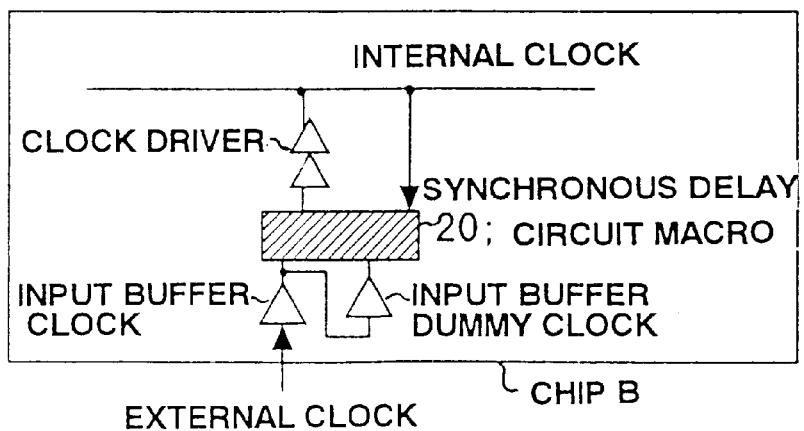

F I G. 1 2 PRIOR ART

FIG. 16 PRIOR ART
(a)
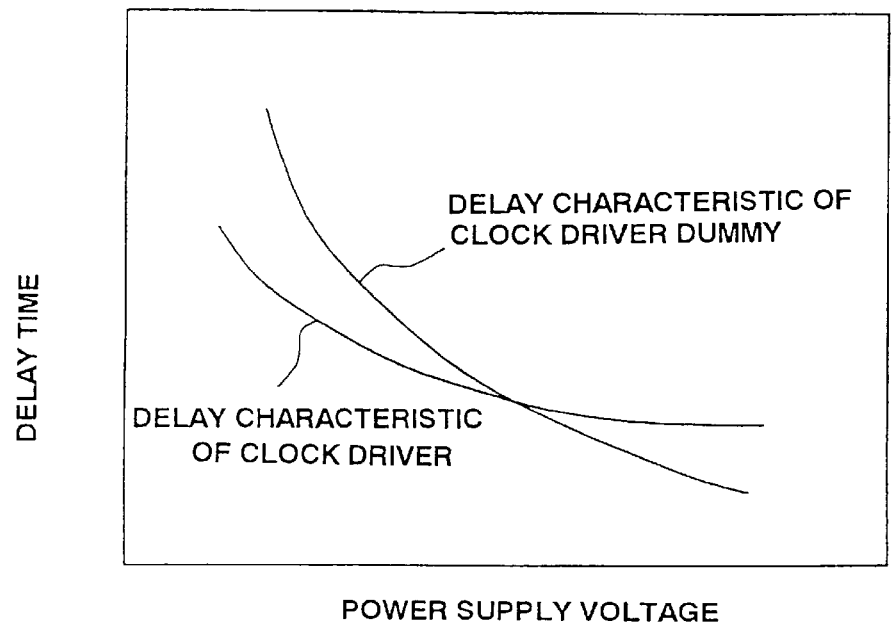
(b)
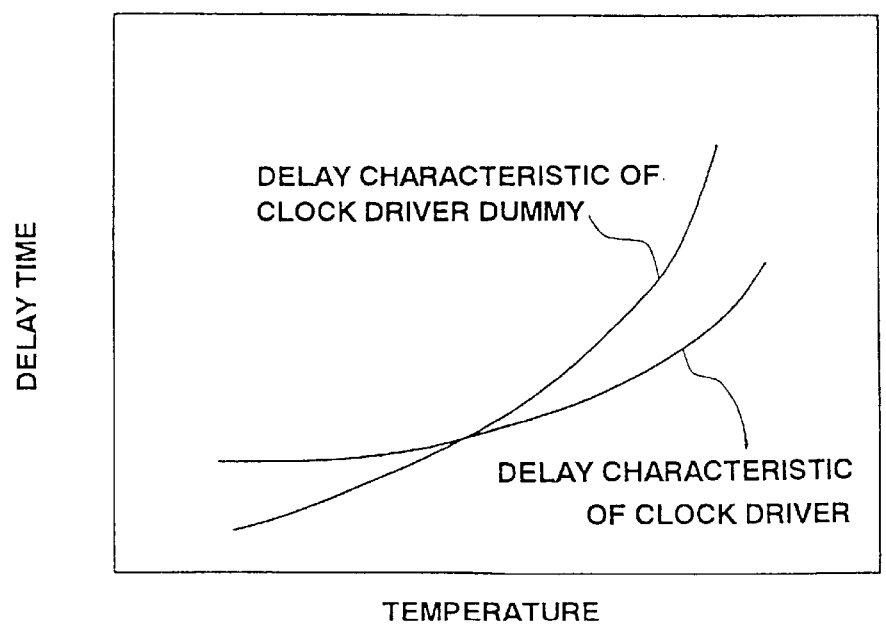

3;INPUT BUFFER
4;CLOCK DRIVER
5;INPUT BUFFER DUMMY
6;OUTER CLOCKS
7;INTERNAL CLOCKS
8;SYNCHRONIZATION DELAY CIRCUIT MACRO
9;MONITOR SIGNAL GENERATING CIRCUIT

3;INPUT BUFFER
4;CLOCK DRIVER
5;INPUT BUFFER DUMMY
6;OUTER CLOCKS
7;INTERNAL CLOCKS
8;SYNCHRONIZATION DELAY CIRCUIT MACRO
9;MONITOR SIGNAL GENERATING CIRCUIT

3;INPUT BUFFER
4;CLOCK DRIVER
5;INPUT BUFFER DUMMY
6;OUTER CLOCKS
7;INTERNAL CLOCKS
8;SYNCHRONIZATION DELAY CIRCUIT MACRO

3;INPUT BUFFER
4;CLOCK DRIVER
5;INPUT BUFFER DUMMY
6;OUTER CLOCKS
7;INTERNAL CLOCKS
8;SYNCHRONIZATION DELAY CIRCUIT MACRO

901;DELAY CIRCUIT CHAIN
902;DELAY CIRCUIT CHAIN
901A;DELAY CIRCUIT CHAIN
902A;DOUBLE-SPEED DELAY CIRCUIT CHAIN
903;INPUT BUFFER
904;CLOCK DRIVER
905;DUMMY DELAY CIRCUIT
905A;INPUT BUFFER
905B;CLOCK DRIVER DUMMY
907;INTERNAL CLOCK
908;SYNCHRONIZATION DELAY CIRCUIT MACRO

3;INPUT BUFFER
4;CLOCK DRIVER
5;INPUT BUFFER DUMMY
6;OUTER CLOCKS
7;INTERNAL CLOCKS
8;SYNCHRONIZATION DELAY CIRCUIT MACRO
10A;SWITCH 1
10B;SWITCH 2

11 ; DELAY CIRCUIT CHAIN
11a;DELAY CIRCUIT CHAIN
12;DELAY CIRCUIT CHAIN
18;CONTROL CIRCUIT

11a;DELAY CIRCUIT CHAIN
12;DELAY CIRCUIT CHAIN
18;CONTROL CIRCUIT

3;INPUT BUFFER
4;CLOCK DRIVER
5;INPUT BUFFER DUMMY
6;EXTERNAL CLOCKS
7;INTERNAL CLOCKS
8;SYNCHRONIZATION DELAY CIRCUIT MACRO
10;SWITCH

SYNCHRONOUS DELAY CIRCUIT

FIELD OF THE INVENTION

This invention relates to a semiconductor integrated circuit and, more particularly, to a synchronous delay circuit for controlling a clock signal.

BACKGROUND OF THE INVENTION

Owing to their circuit simplicity and small current consumption, synchronous delay circuits that eliminate clock skew in a short synchronization time find use in high-speed clock synchronizing circuits. Reference may be had to the following literature describing such synchronous delay circuits:

(1) Japanese Patent Kokai publicaiton No. JP-A-8-237091;

(2) "Skew Minimization Technique for 256 M-bit Synchronous DRAM and Beyond", by Jin-Man Han, et al., 1996 Symp. on VLSI Circ., pp. 192~193;

(3) "Clock Buffer Chip with Absolute Delay Regulation Over Process and Environment Variations", by Richard B. Watson et al., Proc. of IEEE 1992 (Custom Integrated Circuits Conference), 25.2; and (4) "Digital Delay Locked Loop and Design Technique for High-Speed Synchronous Interface", IEICE TRANS. ELECTRON., VOL. E79-C, No. 6, June, 1996, pp. 798~807.

As shown in FIG. 9, a synchronous delay circuit basically comprises a delay circuit 901 used to measure a fixed time difference, a delay circuit 902 for reconstructing the measured delay time, and a dummy delay circuit 905 having a delay time corresponding to delay times td1+td2 obtained by adding delay times td1, td2 of an input buffer 903 and clock driver 904.

In order to make the delay time equal to the delay times td1, td2 of the input buffer 903 and clock driver 904, there are many cases where the dummy delay circuit 905 is composed of an input buffer dummy 905A, which uses circuitry exactly the same as that of the input buffer, and a clock driver dummy 905B.

The delay circuits 901 and 902 are constituted by delay circuit chains having equal delay times, and therefore, they are also referred to as delay circuit chains.

The purpose of the delay circuits 901 and 902 is to measure a fixed period of time (this is the function of circuit 901) and reconstruct this period of time (this is the function of circuit 902). This purpose can be attained by causing a signal to advance through the delay circuit 901 and arrange it so that a number of delay elements equal to the number of delay elements through which the signal passed in the delay circuit 901 will be traversed by the signal in the delay circuit 902.

Methods for arranging the number of delay elements equal to the number of delay elements through which the signal passed in the delay circuit 901 will be traversed by the signal in the delay circuit 902 can be divided into two categories depending upon the propagation directions of the delay circuits 901 and 902 and into two categories depending upon whether the end is selected or the overall path in order to decide the length of the delay circuit 902. There are four types in each of the two categories.

More specifically, if the methods are classified depending upon the propagation directions of the delay circuits 901 and 902, they are considered as the types shown in FIGS. 12 and 13 in which the propagation directions of the delay circuits 901 and 902 are the same and length is decided on the output terminal side of the delay circuit 902 in order to decide the number of elements in the delay circuit 902, and there are the types shown in FIGS. 10 and 11 in which the propagation directions of the delay circuits 901 and 902 are opposite each other and length is decided on the input terminal side of the delay circuit 902 in order to decide the number of elements in the delay circuit 902.

If the methods are classified depending upon whether the end is selected or the overall path in order to decide the length of the delay circuit 902, there are the methods shown in FIGS. 10 and 13 in which the end is selected and the methods shown in FIGS. 11 and 12 in which the overall path is selected.

FIG. 10 corresponds to the scheme described in the above-mentioned Japanese Patent Application Laid-Open No. 8-237091 filed by the present inventor.

FIG. 11 corresponds to the scheme described in the above-mentioned literature (4) (IEICE TRANS. ELECTRON., VOL. E79-C, No. 6, June, 1996, pp. 798~807).

FIG. 12 corresponds to the scheme described in the above-mentioned literature (2) (1996 Symp. on VLSI Circ., pp. 192~193).

FIG. 13 corresponds to the scheme described in the above-mentioned literature (3) (Proc. of IEEE 1992 CICC 25.2) and in the above-mentioned literature (2) (1996 Symp. on VLSI Circ., pp. 112~113).

Operations through which clock skew is eliminated will be described with reference to the schematic views and timing charts of FIGS. 14 and 15.

(1) Clock Delay when Synchronous Delay Circuit is Not Used

FIG. 14 illustrates when a synchronous delay circuit is not used. As shown in FIG. 14(a), an external clock 906 is utilized as an internal clock 907 supplied to the internal circuitry of a semiconductor integrated circuit device through the input buffer 903 and the clock driver 904. The delay time between the external clock 906 and the internal clock 907 is decided by the delay time td1 of the input buffer 903 and the delay time td2 of the clock driver 904. The sum td1+td2 is clock skew.

(2) Principle of Clock Delay Elimination when Synchronous Delay Circuit is Used

A synchronous delay circuit uses a clock pulse enters at a clock period tCK to effectively eliminate clock skew. That is, a delay circuit having a delay time of $$tCK-(td1+td2)$$

is provided and disposed between the input buffer (delay time td1) and the clock driver (delay time td2) so that the sum of the delay times are equal to the clock period tCK [=td1+tCK−(td1+td2)+td2].

As a result, the timing of the internal clock output by the clock driver becomes equal to the timing of the external clock.

(3) Method of Clock Delay Elimination when Synchronous Delay Circuit is Used

FIG. 15(b) shows a timing chart when a synchronous delay circuit is actually used.

The operation of a synchronous delay circuit requires two periods.

The first period is used to measure the delay time tCK−(td1+td2) dependent upon the clock period and to decide the delay length of the delay circuit that reconstructs the delay tCK−(td1+td2).

The next period is used for the amount of delay of tCK−(td1+td2).

With regard to the first period, the dummy delay circuit 905 of the clock driver 904 and the delay circuit chain 901 are used to measure the delay time tCK−(td1+td2) dependent upon the clock period.

The output of input buffer 903 resulting from the first pulse of two consecutive pulses of external clock 906 is caused to advance through dummy delay circuit 905 and delay circuit 901 in one clock period tCK, which extends up to output of the second pulse from the input buffer 903. Since the delay time of the dummy delay circuit 905 is td1+td2, the time needed for a pulse to advance through the delay circuit 901 is tCK−(td1+td2).

The delay time of the delay circuit 902 is set to be equal to the time tCK−(td1+td2) that was required for the pulse to advance through the delay circuit 901.

Although this method of setting the delay circuit 902 can be classified broadly into the four types mentioned above, each is capable of attaining the desired object.

With regard to the next period, a clock pulse that has been output by the input buffer 903 passes through the delay circuit 902 whose delay is tCK−(td1+td2) and is output by the clock driver 904 to thereby produce the internal clock 907 whose delay is exactly equal to the clock cycle tCK.

The process described above provides the internal clock 907, which is free of clock skew, in two clock periods.

Meanwhile, in a synchronous delay circuit adapted for removing clock skew in a shorter synchronous period, there has already been proposed a system configured not only for eliminating skew but also for doubling the clock frequency or generating 50% duty (Duty50) shown for example in JP Patent Kokai JP-A-8-237091 of the above publication [1] by the inventors hereof.

Similarly to the skew eliminating configuration, the circuit for doubling the clock frequency ( frequency doubling circuit) and for generating Duty50 is made up of paired delay circuits, namely a delay circuit for measuring a pre-set time difference and a delay circuit for reproducing the delay time, and is configured for doubling the delay time of the delay circuit for reproducing the delay time to a speed twice as high as that of the delay circuit for measuring the pre-set time difference. In actuality, the circuit for doubling the clock frequency and for generating Duty50 is frequently used in combination with the skew eliminating circuit.

FIG. 25 shows an example of a basic configuration of a synchronous delay circuit. Referring to FIG. 25, this conventional synchronous delay circuit is a conventional synchronous delay circuit, explained with reference to FIG. 9. The synchronous delay circuit shown in FIG. 25 further comprises a pair of delay circuit chains, made up of a delay circuit chain 901 for measuring the clock period, and a delay circuit chain 902 for reproducing the measured delay time, and a pair of delay circuit chains, made up of a delay circuit chain 901A for measuring the pre-set time difference and a delay circuit chain 902A for reproducing the measured delay time (speed-doubling delay circuit chain), with the two pairs of the delay circuit chains being connected in series with each other. An output of the delay circuit chain 902 and an output of the speed-doubling delay circuit chain 902A are synthesized by a synthesis circuit 910A so as to be supplied to a clock driver 904 with delay time td2.

This double frequency generating and Duty50 generating circuit may be classified similarly to the skew removing circuit.

The operation of the double frequency generating and Duty50 generating circuit is explained with reference to a timing chart shown in FIG. 26.

(4) Principle of Clock Delay Removal in Case of Using the Synchronous Delay Circuit For generating the double frequency and Duty50 circuits, the synchronous delay circuit utilizes the properties of the clock pulses being entered every clock period tCK. That is, a double speed delay circuit chain (902A of FIG. 25) with a delay time of tCK/2 is provided and the delay time with respect to the pre-input clock is set so as to be equal to one-half the clock period tCK. The clock signals so set are then synthesized with the original clock signals (output C of the delay circuit chain 902 of FIG. 25) to provide the double frequency (E of FIG. 25) or Duty50%.

(5) Method for Removing Clock Delay in Case of using the Synchronous Delay Circuit The timing operation in case of using the synchronous delay circuit is explained with reference to FIG. 26, which shows a timing chart representing the waveform of each node of FIG. 25.

The operation of the synchronous delay circuit for double frequency generation and Duty50 generation needs of 1.5 periods.

The first one period is used for measuring the delay time tCK which depends on the clock period and for determining the delay length of the delay time adapted for reproducing the delay amount of tCK/2. The next period is used for the delay amount of tCK/2.

In measuring the clock-period-dependent delay time tCK for the first period, a delay circuit chain 901A is used. An output of the first pulse delay circuit chain 902 for the first one of two consecutive pulses of the clocks 906 (C of FIGS. 25 and 26) proceeds through the delay circuit chain 901A during one clock period tCK until outputting of the second delay circuit chain 902. That is, the time during which the pulse proceeds through the delay circuit chain 901A represents the clock period tCK.

The delay time of the delay circuit chain 902A is set so as to be equal to one-half tCK which is the time during which the pulse proceeded through the delay circuit chain 901A.

The methods for setting the delay time of the delay circuit chain 902A are roughly classified into four types according to desired objectives to be achieved.

During the next period, the clocks exiting the delay circuit chain 901A are output through the delay circuit chain 902A having the delay quantity equal to tCK/2 (signal D of FIGS. 25 and 26) so as to be synthesized with the clock exiting the delay circuit chain 902 (signal C of FIGS. 25 and 26) and output to generate internal clocks 907 of the double frequency and internal clocks of the Duty50 (907A of FIG. 26).

By the above process, two clock periods for clock skew removal and 1.5 periods for double frequency and Duty50, totaling at 3.5 periods, provide internal clock double frequency free of clock skew and clocks of Duty50 are produced.

However, this conventional synchronous delay circuit execute clock skew removal and frequency doubling—Duty50 with two clock periods and with 1.5 periods, respectively, thus requiring 3.5 clocks (3.5 tCK) as the time required for skew removal.

SUMMARY OF THE DISCLOSURE

Thus, the problem is raised that, by adding the function of Duty50 and double frequency, it is not possible to exploit the merit proper to the circuit sufficiently.

Since the amount of dummy delay of the clock is fixed in the synchronous delay circuit of the prior art described above, it is necessary to estimate the fixed amount of delay in advance. In a device such as a microprocessor or memory wherein the amount of clock delay can be estimated in advance, all design from design of transistors to design of wiring is performed collectively. This means that designing the clock driver dummy is not that difficult.

However, in a case where a synchronous delay circuit is used as a macro such as an ASIC (Application Specific Integrated Circuit), a transistor gate process for designing the dummy delay circuit and a wiring process which governs the actual clock delay represents separate design processes. With devices in which the amount of clock delay differs depending upon the wiring design used in the chip, designing the clock dummy delay circuit is difficult and it is necessary to design the dummy delay circuit after the wiring is laid out. This is highly inefficient.

Accordingly, the pattern designed in advance as a macro is solely that of the delay circuit chains 901, 902, and it is necessary to acquire an area for the clock driver dummy 905B beforehand (see FIG. 9) for purposes of layout. This is uneconomical.

Also, in devices in which it is possible to pre-estimate the clock delay quantity in micro-processors or memory devices, the delay quantity of the clock driver dummy and that of the original clock driver produce difference in the temperature and source voltage depending on the delay time, as shown in FIG. 16, such that it is difficult to realize satisfactory matching of characteristics.

The result is that the error between the delay amount of the clock driver and that of the original clock driver occasionally leads to error in skew removal.

In the conventional synchronous delay circuit explained with reference to FIGS. 25 and 26, the time required for skew removal needs 3.5 clocks, due to addition of the double frequency and Duty50 functions. On the other hand, elongation of the synchronous time leads to only insufficient exploitation of the merits of the circuit.

Accordingly, an object of the present invention is to provide a synchronous delay circuit that dispenses with a clock driver dummy delay circuit, wherein even if the circuit is applied to a device such as an ASIC in which the amount of clock delay differs from chip to chip, it is no longer necessary to design a clock driver dummy whenever a wiring design is changed and no longer necessary to give consideration to the layout of an area for the clock driver dummy, thereby making possible highly efficient, economical design.

It is another object of the present invention to provide a synchronous delay circuit whereby the time required for obtaining the internal clocks of the double frequency is substantially free of skew with respect to external clocks, and internal clocks of Duty50.

According to the present invention, the foregoing object is attained by providing a synchronous delay circuit comprising a first delay circuit chain propagating a pulse or pulse edge therethrough for a fixed period of time, a second delay circuit chain capable of passing a pulse or pulse edge over a length proportional to the length of the first delay circuit chain along which the pulse or pulse edge propagated, and a circuit outputting a monitor signal for a period of time over which a clock pulse is propagating through a clock driver, wherein the first delay circuit chain is constituted by a clocked inverter and propagation of the pulse or pulse edge through the first delay circuit chain ends or ceases at any desired timing during the output of the monitor signal.

During the time period when the clock pulses travel through the first delay circuit chain 1 and when the pulses or edges travel through the clock driver during the clock period tCK, the progress of the pulses or edges in the first delay circuit chain ends in order to realize the delay of tCK−(d1+d2) without clock driver dummy.

The synchronous delay circuit according to another aspect of the present invention includes a first delay circuit chain for allowing pulses or pulse edges to proceed for a pre-set time, a second delay circuit chain allowing pulses or pulse edges to travel therethrough a length proportionate to the length by which the pulses or pulse edges travel through the first delay circuit chain, and a circuit for retrieving monitoring signals during the period the clock pulses are traveling through the clock driver, the first delay circuit chain being formed by a clocked inverter and travel of the pulses or edges through the first delay circuit chain ending at any desired timing during outputting of the monitoring signals.

The synchronous delay circuit according to a third aspect of the present invention also includes a third delay circuit chain for allowing pulses or pulse edges to proceed for a pre-set time, and a second delay circuit chain allowing pulses or pulse edges to travel therethrough a length proportionate to the length by which the pulses or pulse edges travel through a fourth delay circuit chain, the third delay circuit chain being formed by a clocked inverter, with the clocks being halted during any desired period of time after allowing the pulses or pulse edges to travel through the fourth delay circuit chain for a pre-set period.

PREFERRED EMBODIMENTS OF THE INVENTION

The present invention is hereinafter explained with reference to preferred embodiments thereof.

Embodiment 1

FIG. 1 shows a constitution of a synchronous delay circuit according to a first embodiment of the present invention and a timing chart. Referring to FIG. 1, the first embodiment of the present invention includes a synchronous delay circuit made up of a delay circuit chain 1 for measuring a pre-set time interval, a delay circuit chain 2 for reproducing the measured delay time, the input buffer 3 and the clock driver 4. The clock driver 4 furnishes internal clocks 7 to an internal circuit (sequencing circuit), not shown. An input buffer dummy 5 is configured similarly to the input buffer 4 and has the same delay time.

An output A of the input buffer 3 is sent to an input end of a switch 10 (changeover unit) and to the delay circuit chain 1 for measuring the period. The other input end of the switch 10 is entered an output of the delay circuit chain 2 for reproducing the delay. An output of the switch 10 is sent to an input of the clock driver 4 and to a reset terminal of a monitor signal generating circuit 9. An output of the clock driver 4 is supplied via the input buffer dummy 5 to a set terminal of the monitor signal generating circuit 9, an output D of which is sent to the delay circuit chain 1. The monitor signal generating circuit 9 outputs the monitor signal D, by way of activation thereof, during the time clock pulses are traveling through the clock driver 4 and the input dummy 5.

In the first embodiment of the present invention, the clock period is measured by allowing the clock signals to pass through the delay circuit chain 1 used for measurement. However, during the time when clock skew is likely to be produced, as when the clocked pulses are traveling through the clock driver 4 or when the clocked pulses are traveling through the input dummy 5, the monitor signal D from the monitor signal generating circuit 9 becomes active to inhibit signal passage through the delay circuit chain 1 to discontinue the measurement of the clock period tCK.

Therefore, the time during which signals travel through the delay circuit chain 1 (during measurement time) is just equal to the clock period tCK less the sum of the delay time td2 of the input buffer 3 and the delay time td1 of the clock driver 4 (tV=tCK−(td1+td2)), while the delay time reproduced by the delay circuit chain 2 (synchronous delay time) is tV=tCK−(td1+td2).

The result is that just one clock has to pass for the clock pulse to pass through the input buffer 3, delay circuit chain 2 and the clock driver 4 (td2+td1+tV=td2+td1+tCK−(td1+td2)=tCK) such that the internal clocks 7 output by the clock driver 4 are substantially freed of skew with respect to the external skew.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 5 is a diagram showing the layout of elements in the chip of a macro according to the first embodiment of the present invention;

FIGS. 16A and 16B are characteristic diagrams showing the dependence of clock driver and dummy circuit delay times on power supply voltage and temperature.

FIG. 16 is a graph showing delay characteristics of a dummy delay circuit and a clock driver.

Figure 1:
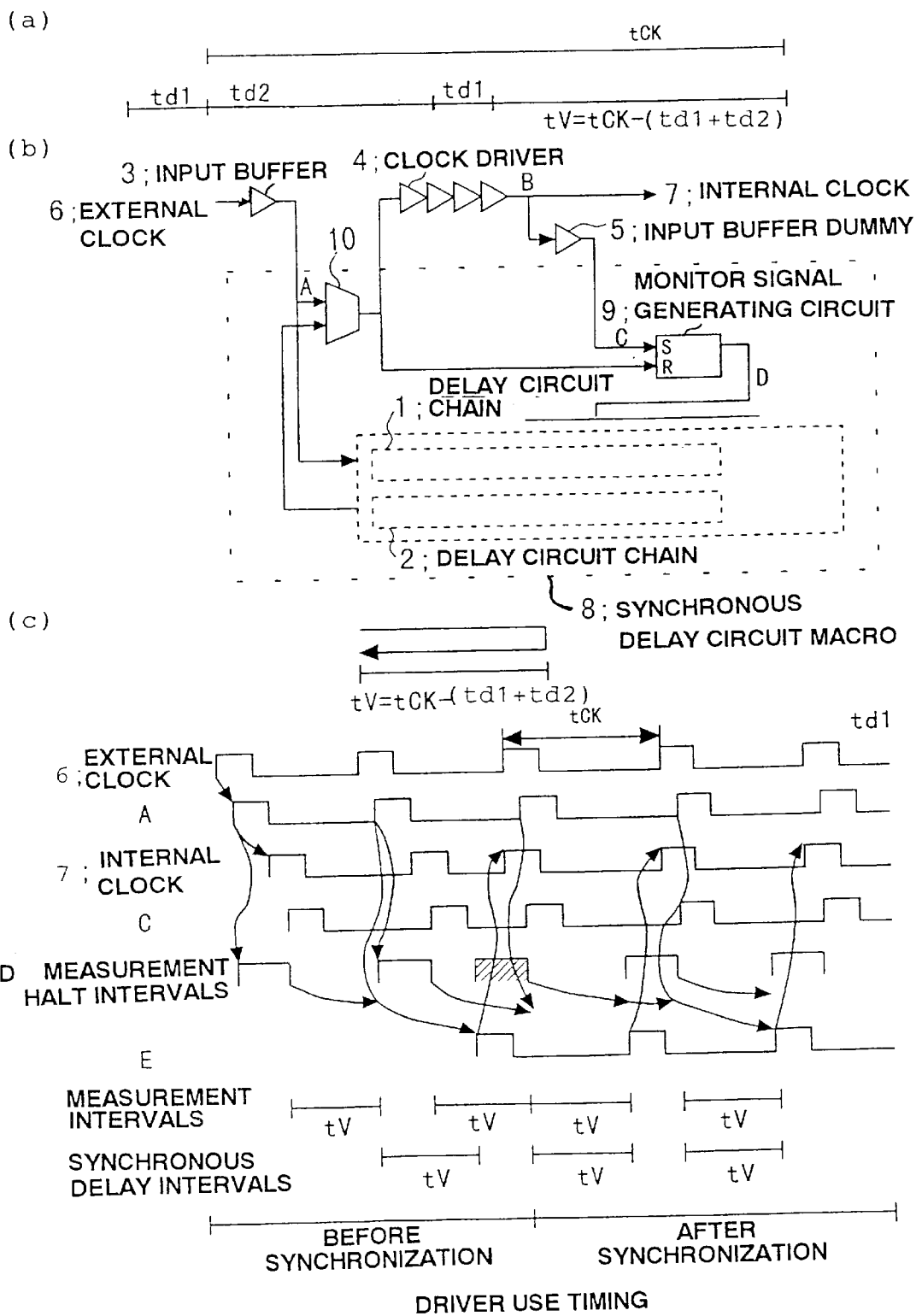
FIG. 1 is a diagram illustrating an arrangement for practicing the present invention, as well as an associated timing chart.

Further, a monitor signal generating circuit 9 for outputting a monitor signal D in the period of time during which a pulse is propagating through the clock driver 4 and input buffer dummy 5 is constituted by an RS flip-flop or the like. In a case where the time (td1+td2), which is obtained by adding the amounts of delay in the clock driver 4 and input buffer dummy 5, is longer than the clock period tCK, the monitor signal generating circuit 9 outputs the monitor signal D for a period of time equivalent to this excess time, namely for a period of time equivalent to the remainder obtained by dividing the sum of the delays of clock driver 4 and input buffer dummy 5 by the clock period tCK. The monitor signal D ceases the signal undergoing measurement in the delay circuit chain 1. Consequently, clock skew is eliminated even in a case where the sum of the delays of clock driver 4 and input buffer dummy 5 is longer than the clock period tCK.

As shown in the timing chart of FIG. 1(c), the monitor signal D that ceases the propagation of the clock signal through the delay circuit chain 1 monitors the period of time over which the clock pulse traverses the clock driver 4. This means that the timing at which the clock pulse propagates through the clock driver 4 becomes earlier by tCK−(td1+td2) from the moment the clock has been synchronized. Accordingly, at the changeover from the state before synchronization to the state after synchronization, the monitor signal D will output two times in one period. (This is indicated by the shaded signal portion of the monitor signal D and the signal portion preceding it in the timing chart of FIG. 1(c).) However, this is avoided by ending the shaded monitor signal D in the timing chart of FIG. 1(c) by the first output of a signal E, which is the output of the delay circuit chain 2, or by halting the shaded monitor signal D in the timing chart of FIG. 1(c) by a method such as ending the advance of a pulse to the clock driver 4.

DETAILED DESCRIPTION OF THE PREFERRED EMBODIMENTS

Preferred embodiments of the present invention will now be described in greater detail with reference to the drawings starting with examples for the embodiments.

[FIRST EXAMPLE]

Figure 2:
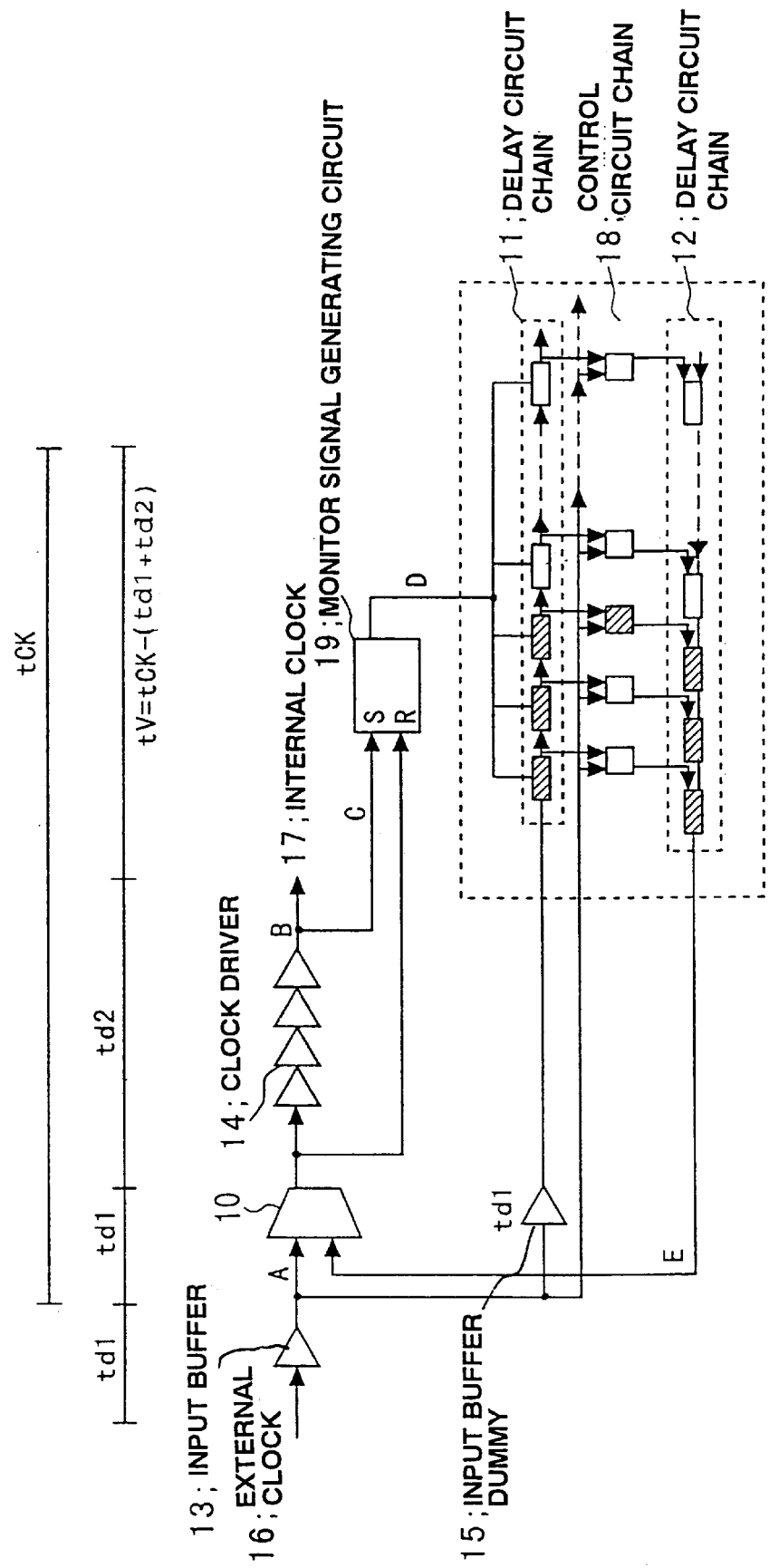
FIG. 2 is a diagram showing a circuit arrangement according to a first embodiment of the present invention.

FIG. 2 is a diagram showing a circuit arrangement according to a first example of the present invention.

This example employs a scheme in which a delay circuit chain 11 for measuring the clock period tCK and a delay circuit chain 12 for reconstructing the measured period are arranged in mutually opposing directions.

Figure 10:
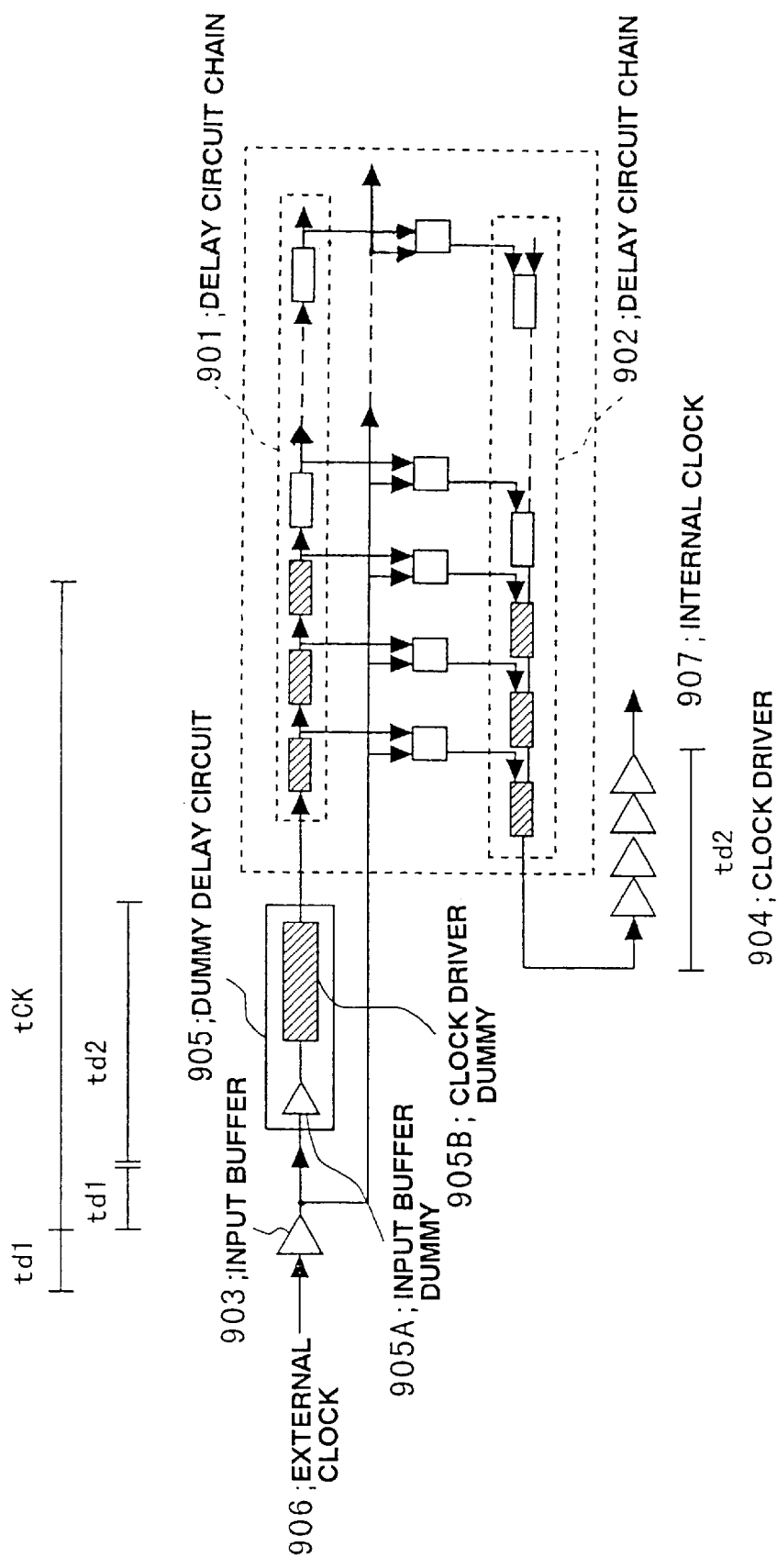
FIG. 10 is a diagram showing a first circuit arrangement according to the prior art.

This scheme in which the delay circuit chain 11 and the delay circuit chain 12 for reconstructing the measured period are arranged in opposite directions is such that a clock pulse propagates through the delay circuit chain 11 and then is transferred to the delay circuit chain 12 via a control circuit chain 18 when the next clock pulse is output by an input buffer 13. This arrangement corresponds to the scheme set forth in Japanese Patent Application Laid-Open No. 8-137091 described above in connection with FIG. 10.

More specifically, the arrangement shown in FIG. 2 comprises the delay circuit chain 11 capable of extracting an output from any position along the signal transfer path, the delay circuit chain 12 capable of accepting a signal from any position along the signal transfer path, and a control circuit chain 18 having signal input terminals, signal output terminals and input/output control terminals. The delay circuit chains 11 and 12 are so arranged that their signal transfer paths are in opposing directions. Sides near the input to the delay circuit chain 11 and sides near the output of the delay circuit chain 12 are successively connected via the control circuit chain 18. After a signal enters the delay circuit chain 11, a signal enters an input/output control terminal of the control circuit chain 18 and a signal in the delay circuit chain 11 is transferred to the delay circuit chain 12.

Figure 3:
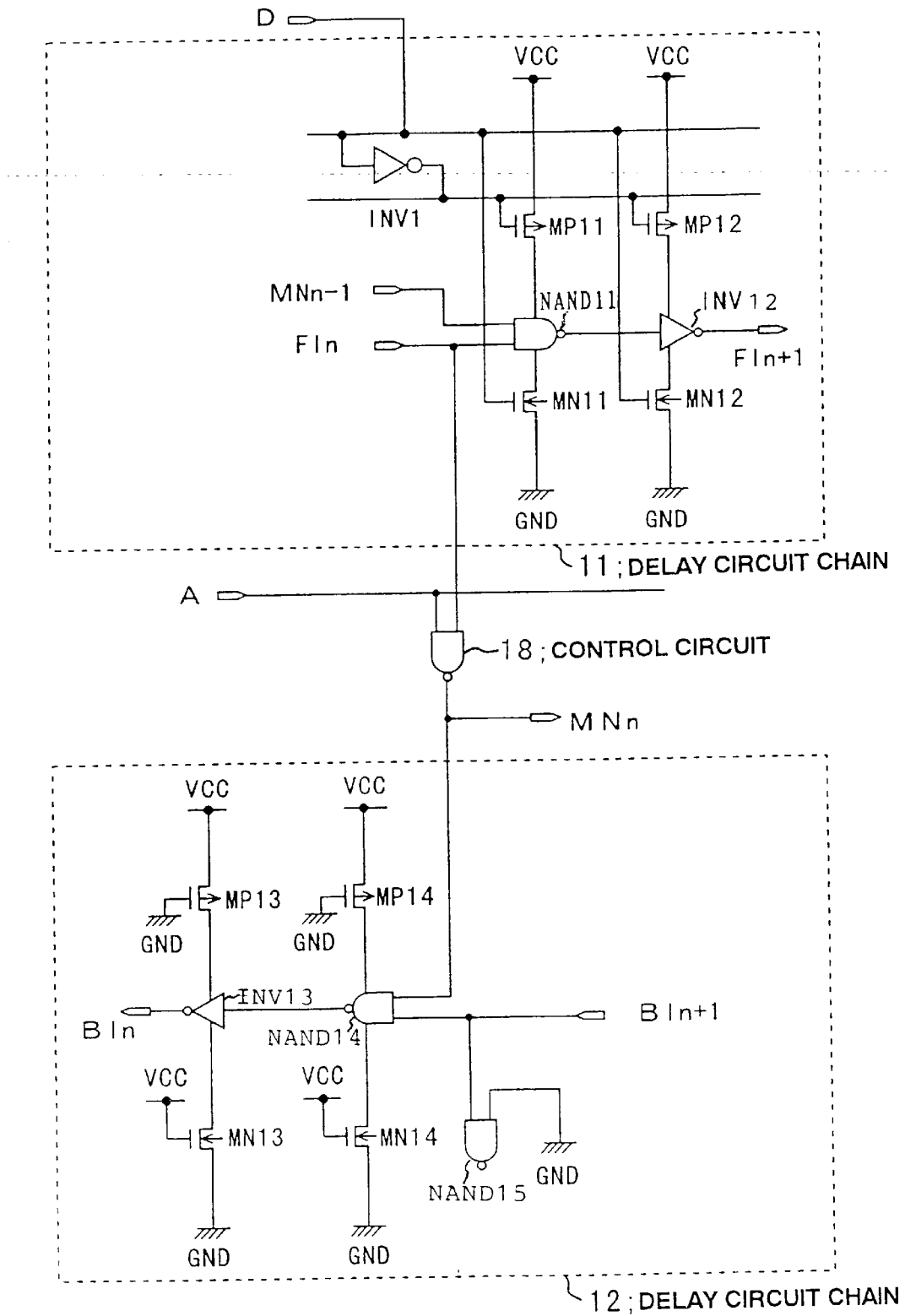
FIG. 3 is a diagram showing an example of elements constituting the first embodiment of the present invention.

FIG. 3 is a diagram showing the construction of the delay circuit chain 11, delay circuit chain 12 and control circuit 18 according to this embodiment.

In order to dispense with a clock driver dummy, this example of the present invention is so adapted that the elements constituting the delay circuit 11 and delay circuit 12 construct clocked inverters. In the period of time over which a clock pulse passes through a clock driver 14, N-channel MOS transistors MN11, MN12 and P-channel MOS transistors MP11, MP12 are turned off by a signal D generated by a monitor signal generating circuit (SR flip-flop) 19 from the input and output of the clock driver 14, whereby the clock pulse is not allowed to propagate through the delay circuit chain 11. In other words, when a clock pulse enters the clock driver 14 in FIG. 2, the RS flip-flop 19 is reset so that the signal D assumes the low level. At the moment the clock pulse is output by the clock driver 14, the RS flip-flop 19 is set, as a result of which the signal D rises to the high level. Thus, in the period of time required for the clock pulse to traverse the clock driver 14, the signal D is at the low level and the MOS transistors are OFF.

The clocked inverter of the delay circuit 12 is arranged to provide a delay time equal to that of the delay circuit 11 and is ON at all times. That is, the design is such that MOS transistors MN13, MN14, MP13, MP14 are in the ON state.

An nth delay element will be described with reference to FIG. 3. An output FIn of an (n–1)th inverter (not shown) of the delay circuit chain 11 enters a NAND gate 11 and is connected to whichever input terminal of two input terminals of a NAND gate of the control circuit chain 18 is not connected to a control terminal A. An output MNn of the NAND gate of control circuit 18 is connected to whichever input terminal of two input terminals of an (n+1)th NAND gate (not shown) of the delay circuit chain 11 is not connected to the output FIn+1 of an nth inverter INV12, and is further connected to whichever input terminal of two input terminals of a NAND gate 14 in the delay circuit chain 12 is not connected to an output BIn+1 of the preceding inverter. The output of the NAND gate 14 of delay circuit chain 12 is connected to the input of an inverter INV13 of the delay circuit chain 12. The output BIn+1 of the preceding inverter of NAND gate 14 of delay circuit chain 12 enters the NAND gate 14 and is connected to whichever input terminal of two input terminals of a NAND gate 15 (a load adjusting element) is not connected to a ground line. The output of the NAND gate 15 constituting the ground adjusting element is left unconnected (i.e., the output is left in the open state).

As shown in FIG. 2, the input buffer dummy 15 is disposed in front of the delay circuit chain 11, in a manner similar to that of the prior art. The time for passage of a signal is equal to that of the input buffer 3.

By virtue of this arrangement, the time required for a clock pulse to travel through the delay circuit chain 11 can be made tCK−(td1+td2) in the manner described above.

Next, a circuit arrangement for a case where the macro of an ASIC (Application Specific Integrated Circuit) is constructed as a modification of the present invention will be described with reference to FIG. 4.

Circuits and wiring such as for the clock driver 14 and input buffer 13 which differ depending upon the ASIC chip cannot be laid out in a macro.

Figure 4:
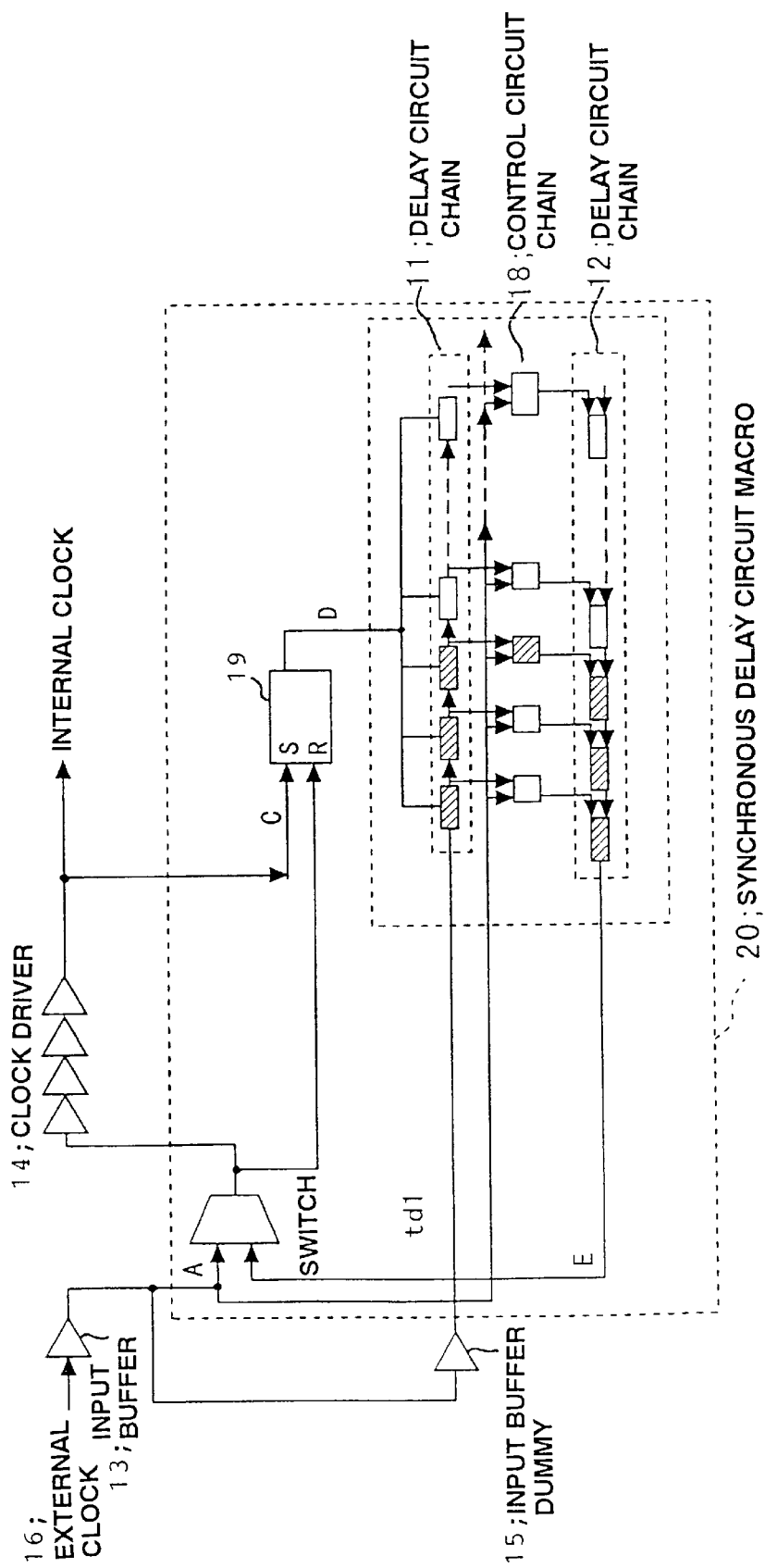
FIG. 4 is a diagram showing the construction of a macro according to the first embodiment of the present invention.

Accordingly, as shown in FIG. 4, the clock driver 14, input buffer 13 and input buffer dummy 15 are disposed externally of a synchronous delay circuit macro 20.

By thus placing elements that are dependent upon the chip construction externally of the macro, it is possible to eliminate clock skew, without performing any adjustment of clock driver dummy delay required in the prior art, even in a case where the synchronous delay circuit macro 20 is placed on chips A and B of different sizes and wiring, as shown in FIG. 5.

[SECOND EXAMPLE]

Figure 6:
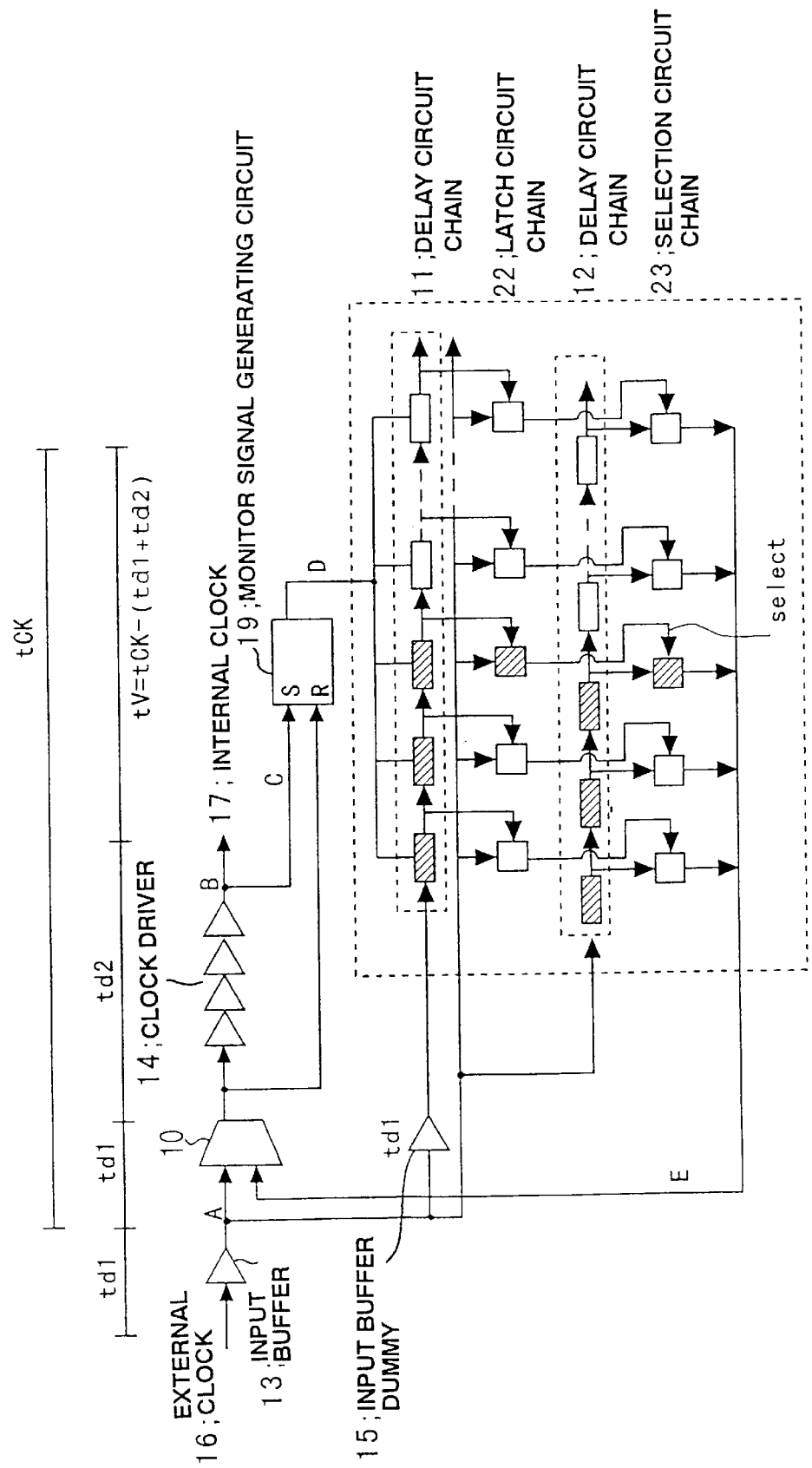
FIG. 6 is a diagram showing a circuit arrangement according to a second embodiment of the present invention.

FIG. 6 is a diagram illustrating a circuit arrangement according to a second example of the present invention.

As shown in FIG. 6, this example employs a scheme in which the delay circuit chain 11 for measuring the clock period tCK and the delay circuit chain 12 for reconstructing the measured period are arranged in the same direction.

Figure 12:
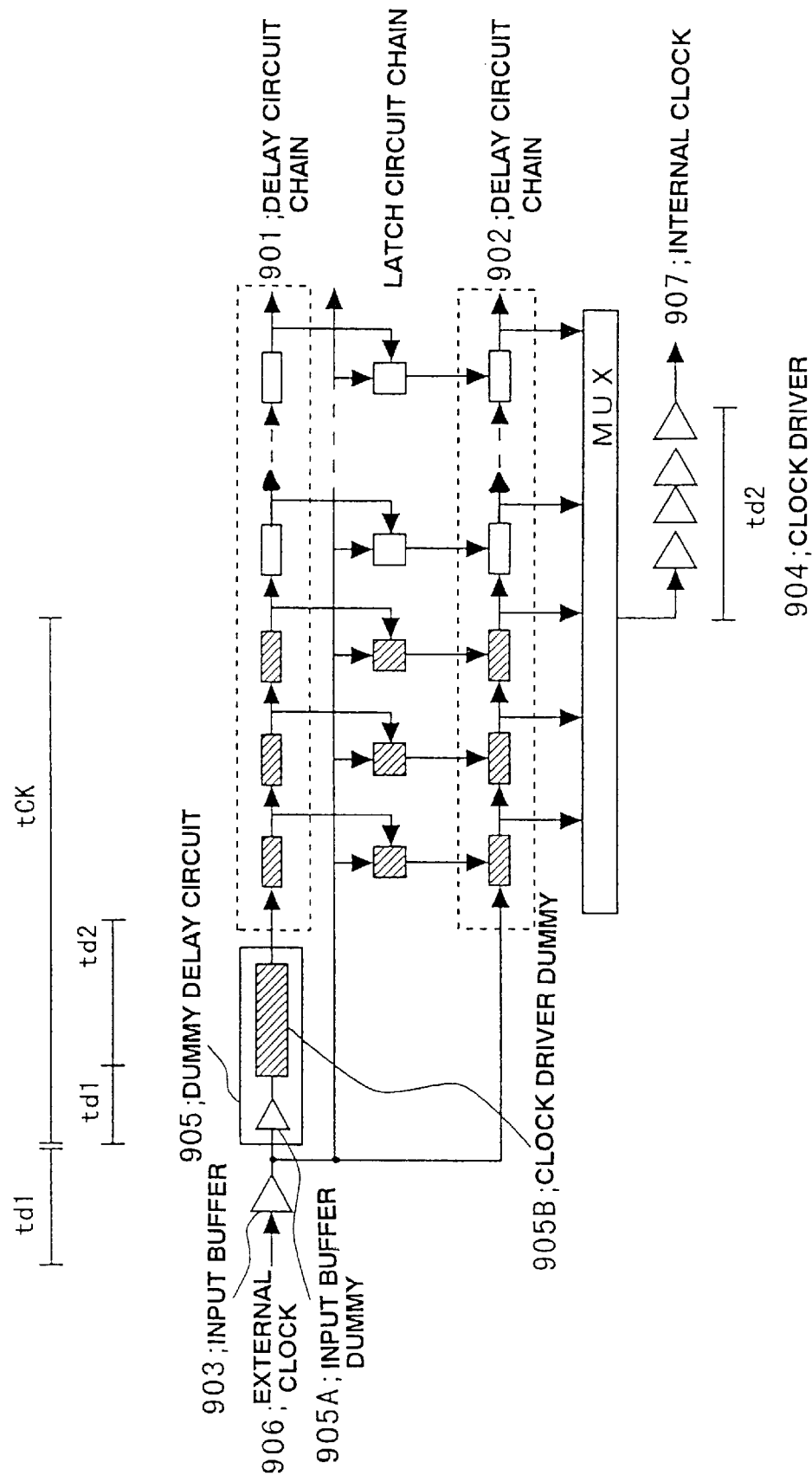
FIG. 12 is a diagram showing a third circuit arrangement according to the prior art.

This scheme in which the delay circuit chain 11 and the delay circuit chain 12 for reconstructing the measured period are arranged in the same direction is such that a clock pulse propagates through the delay circuit chain 11 and the output of the delay circuit chain 12 is selected when the next clock pulse is output by the input buffer 13. This arrangement corresponds to the scheme set forth in literature (2) (1996 Symp. on VLSI Circ. pp. 192~193), explained above in connection with FIG. 12.

In this example also the elements constituting the delay circuit 11 and delay circuit 12 construct clocked inverters. In the period of time over which a clock pulse passes through the clock driver 14, the clock pulse is not allowed to propagate through the delay circuit chain 11 by the signal D produced by the monitor signal generating circuit (RS flip-flop) 19 from the input and output of the clock driver 14. This makes it possible to eliminate the clock driver dummy. In addition, the circuitry can be used as an ASIC macro in a manner similar to that of the first embodiment.

[THIRD EXAMPLE]

Figure 7:
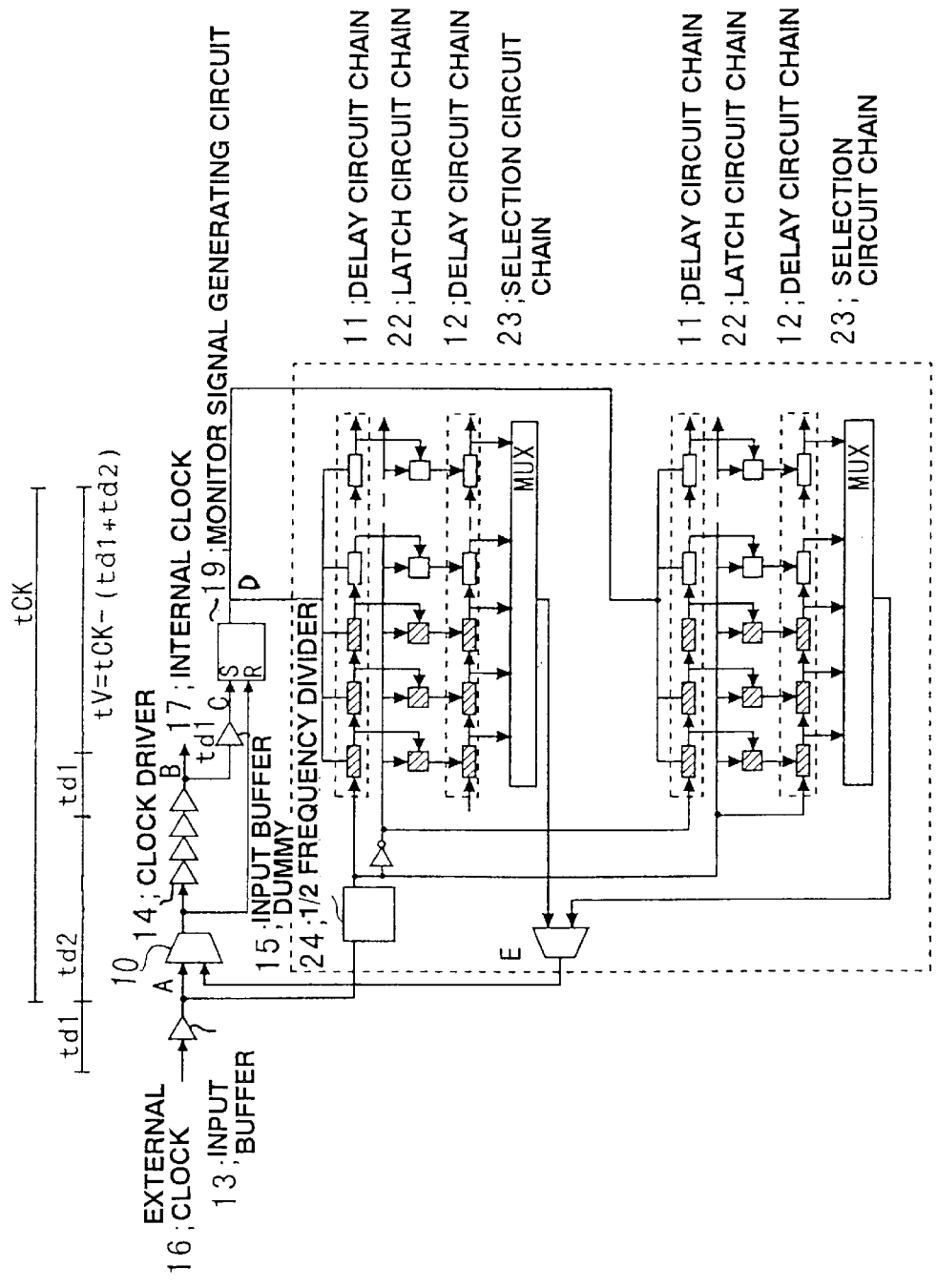
FIG. 7 is a diagram showing a circuit arrangement according to a third embodiment of the present invention.

FIG. 7 is a diagram illustrating a circuit arrangement according to a third example of the present invention.

As shown in FIG. 7, this example employs a scheme in which the delay circuit chain 11 for measuring the clock period tCK and the delay circuit chain 12 for reconstructing the measured period are arranged in the same direction and a pulse edge is propagated through the circuit.

This scheme in which the delay circuit chain 11 and the delay circuit chain 12 for reconstructing the measured period are arranged in the same direction is such that a clock pulse edge propagates through the delay circuit chain 11 and the output of the delay circuit chain 12 is selected when the next clock pulse is output by the input buffer 13. This arrangement corresponds to the prior-art schemes set forth in literature (3) (Proc. of IEEE 1992 CICC 25.2) and in literature (2) (1996 Symp. on VLSI Circ., pp. 112~113) described above in connection with FIG. 13.

Since a clock pulse edge is used in this embodiment, measurement of the clock period by the delay circuit 11 and measurement by the delay circuit 12 is not possible by the single delay circuit 11 and the single delay circuit 12. Accordingly, a clock having a duty of 50% must be prepared and use of the measurement and delay circuits must be repeated every half period, or it is necessary to provide two sets of the delay circuit chains and operate the sets alternately every period.

In this example, two sets of the delay circuit chains are provided and the sets are operated alternately every period. In other words, the output of the input buffer 13 to which the external clock is applied is input to a ½ frequency divider 24, whereby the clock is frequency divided and then supplied to the two sets of delay circuit chains.

In this example also the elements constituting the delay circuit 11 and delay circuit 12 construct clocked inverters. In the period of time over which a clock pulse passes through the clock driver 14, the clock pulse is not allowed to propagate through the delay circuit chain 11 by the signal D produced by the monitor signal generating circuit 19 from the input and output of the clock driver 14. This makes it possible to eliminate the clock driver dummy. In addition, the circuitry can be used as an ASIC macro in a manner similar to that of the first embodiment.

[FOURTH EXAMPLE]

Figure 8:
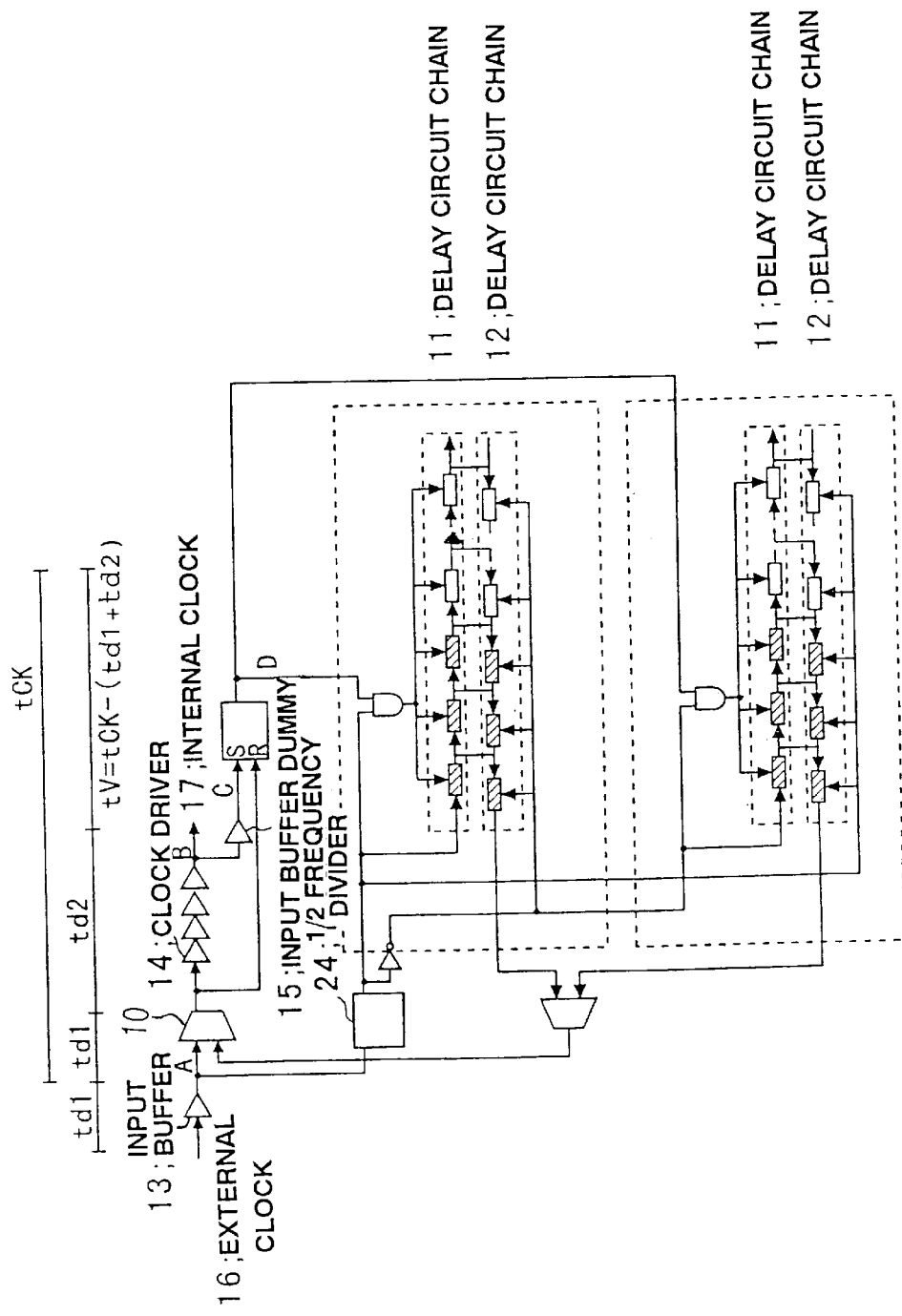
FIG. 8 is a diagram showing a circuit arrangement according to a fourth embodiment of the present invention.
Figure 9:
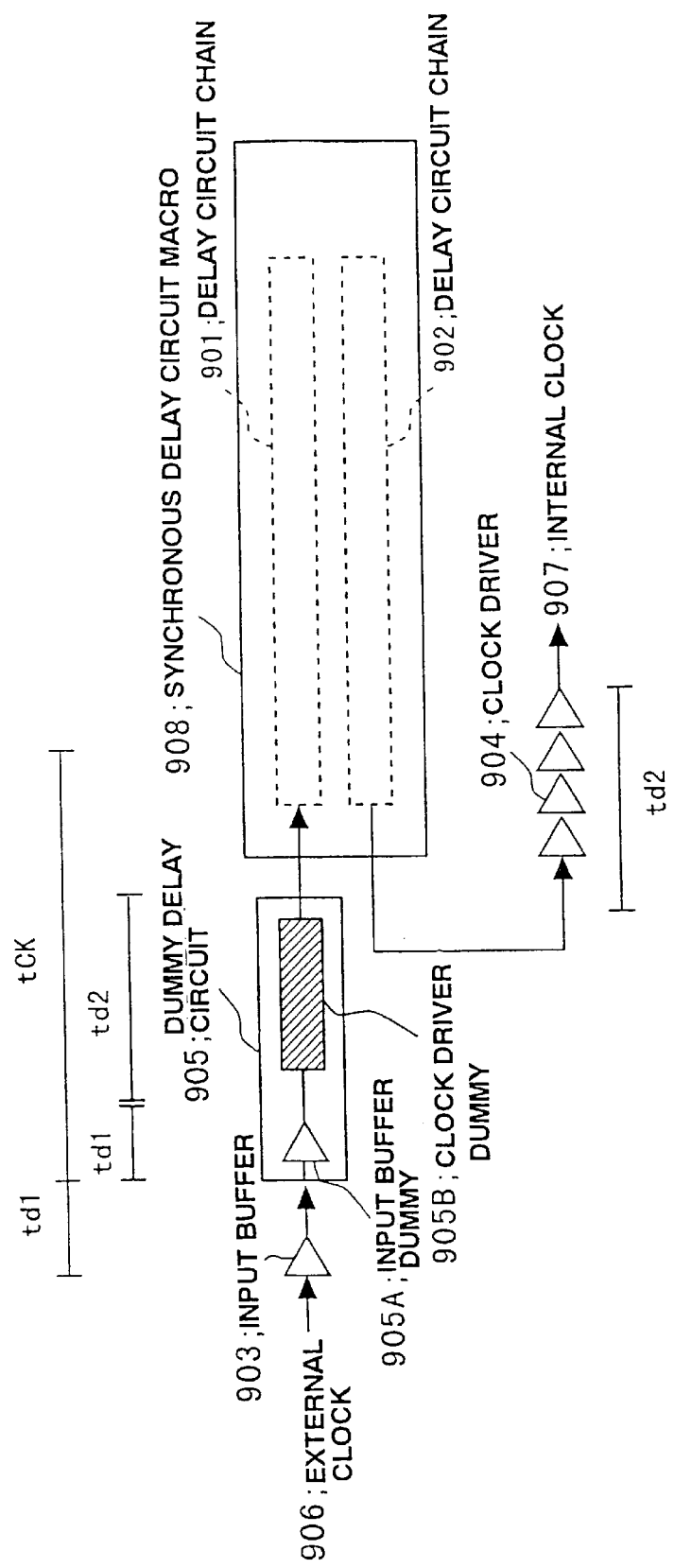
FIG. 9 is a diagram showing a circuit arrangement according to the prior art.

FIG. 8 is a diagram illustrating a circuit arrangement according to a fourth example of the present invention.

As shown in FIG. 8, this example employs a scheme in which the delay circuit chain 11 for measuring the clock period tCK and the delay circuit chain 12 for reconstructing the measured period are arranged in opposite directions and a pulse edge is propagated through the circuit.

This scheme in which the delay circuit chain 11 and the delay circuit chain 12 for reconstructing the measured period are arranged in opposite directions is such that a clock pulse edge travels through the delay circuit chain 11 and the output of the delay circuit chain 12 is selected when the next clock pulse is output by the input buffer 13. This arrangement corresponds to the prior-art scheme set forth in literature (4) (IEICE TRANS. ELECTRON., VOL. E79-C, No. 6, June, 1996, pp. 798~807) described above in connection with FIG. 11.

Since a clock pulse edge is used in this example, measurement of the clock period by the delay circuit 11 and measurement by the delay circuit 12 is not possible by the single delay circuit 11 and the single delay circuit 12. Accordingly, two sets of the delay circuit chains are provided and the sets are operated alternately every period.

In this example also the elements constituting the delay circuit 11 and delay circuit 12 construct clocked inverters. In the period of time over which a clock pulse passes through the clock driver 14, the clock pulse is not allowed to propagate through the delay circuit chain 11 by the signal D produced by the monitor signal generating circuit 19 from the input and output of the clock driver 14. This makes it possible to eliminate the clock driver dummy. In addition, the circuitry can be used as an ASIC macro in a manner similar to that of the first embodiment.

Embodiment 2

Figure 17:
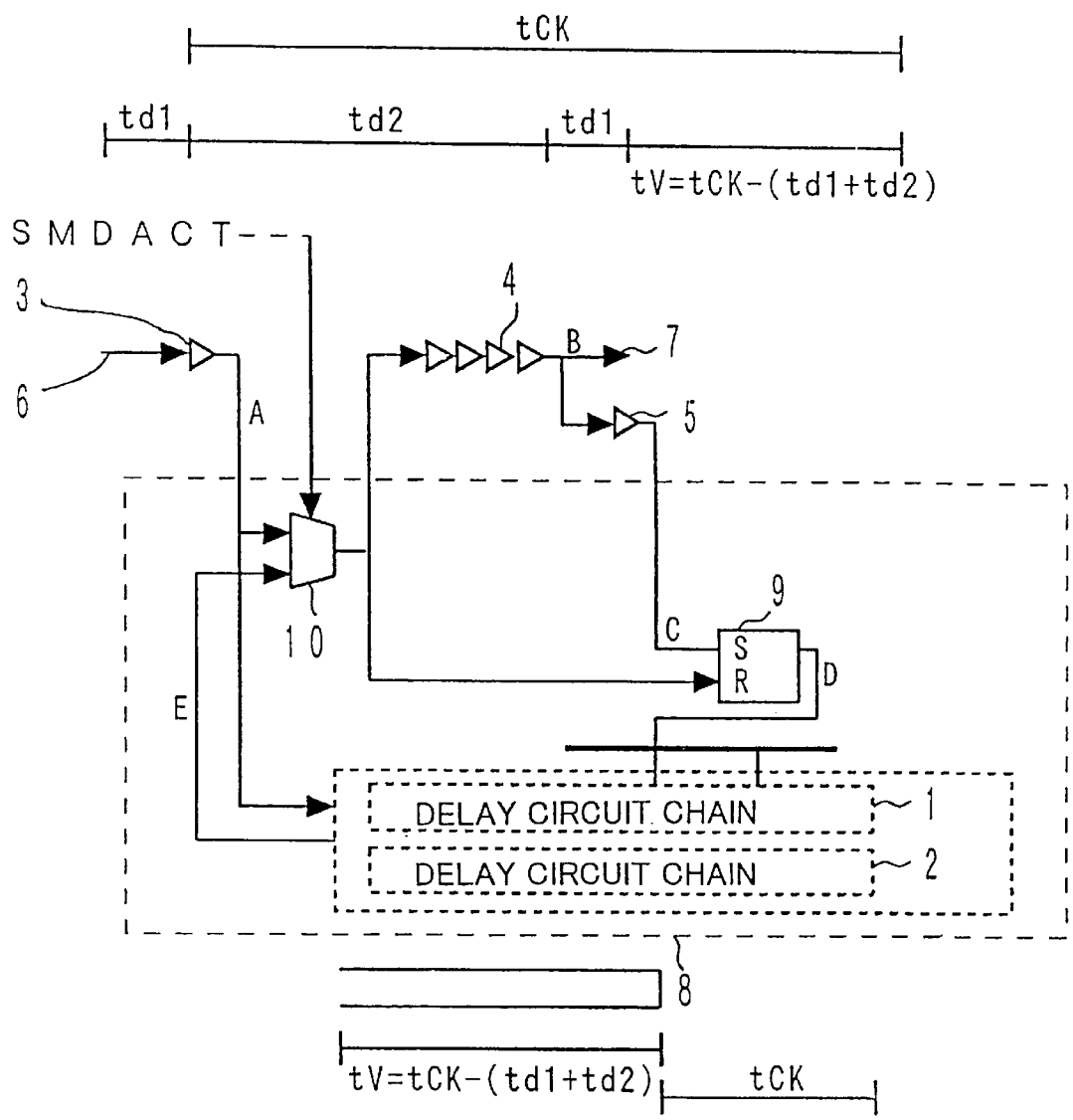
FIG. 17 shows the configuration of a second embodiment of the present invention.
Figure 18:
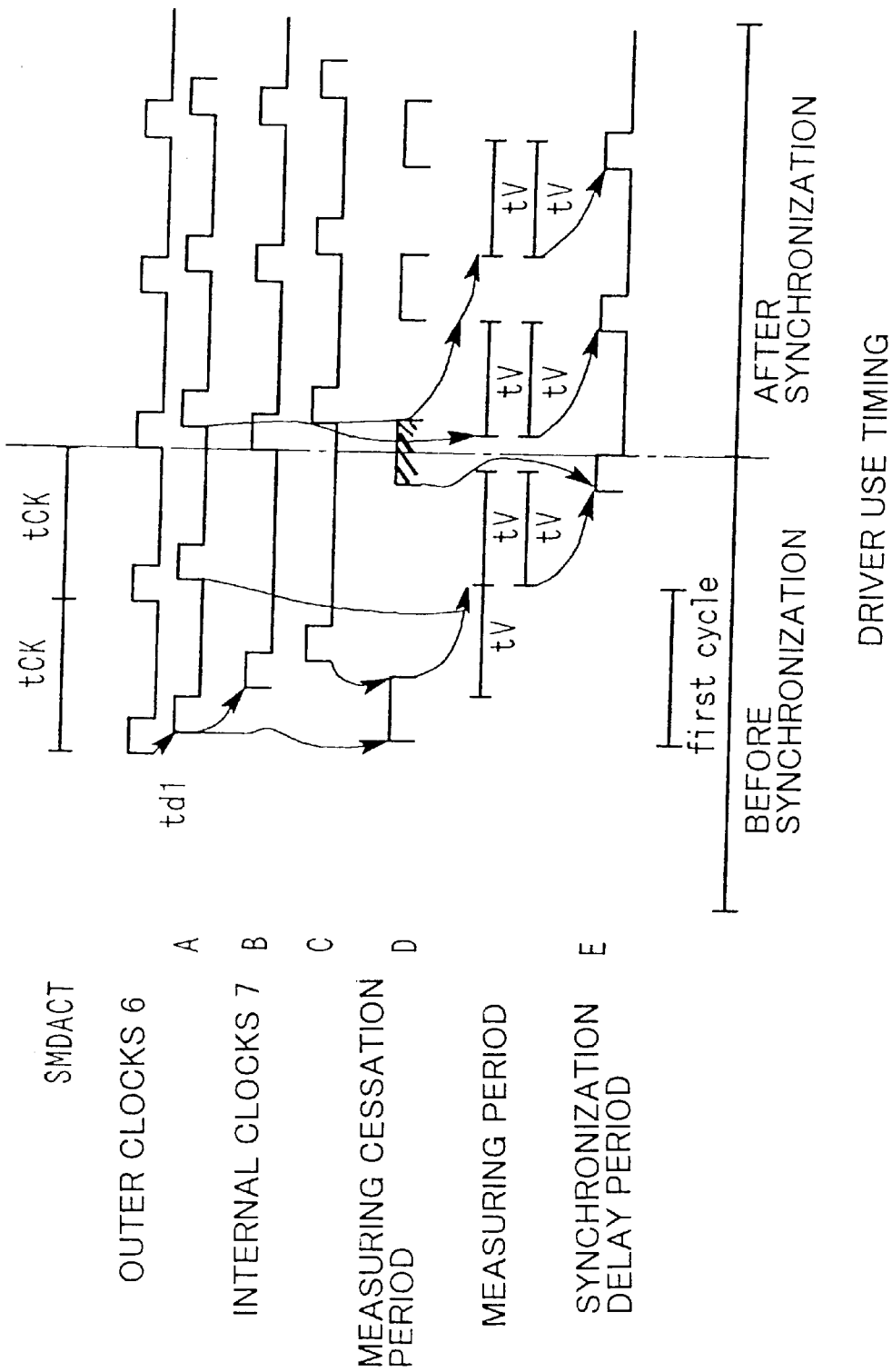
FIG. 18 is a timing chart for illustrating the operation of the second embodiment of the present invention.

The second embodiment of the present invention is now explained. FIG. 17 shows the configuration of the second embodiment of the present invention and FIG. 18 shows the timing chart for illustrating the operation of the second embodiment and specifically illustrate the timing waveform of various components of FIG. 1, respectively Referring to FIG. 17, the second embodiment of the present invention includes a synchronous delay circuit made up of a delay circuit chain 1 for measuring a pre-set time interval and a delay circuit chain 2 for reproducing the measured delay time. The second embodiment also includes an input buffer 3, a clock driver 4, an input dummy 5 and a monitor signal generating circuit 9. The clock period is measured by allowing the clock signals to pass through the delay circuit chain 1 used for measurement. However, during the time clock skew is likely to be produced, as when the clocked pulses are traveling through the clock driver 4 or when the clocked pulses are traveling through the input dummy 5, the clock signals are prohibited from proceeding through the delay circuit chain 1 to discontinue the measurement of the clock period tCK.

Therefore, the time during which signals are traveling through the delay circuit chain 1 is just equal to the clock period tCK less the sum of the delay time td2 of the input buffer 3 and the delay time td1 of the clock driver 4(tCK−(td1+td2), while the delay time reproduced by the delay circuit chain 2 is also tCK−(td1+td2).

The result is that just one clock has to pass for the clock pulse to pass through the input buffer 3, delay circuit chain 2 and the clock driver 4 such that the internal clocks 7 output by the clock driver 4 are substantially freed of skew. Meanwhile, the switch 10 switches between the output of the delay circuit chain 12 and the external clocks 6 by a signal SMDACT.

If, when the circuit for outputting the monitor signal during the time the pulses are traveling through the clock driver 4 and the input dummy 5 by a set-reset flipflop (SR flipflop), the sum of the delay in the clock driver 4 and that in the input dummy 5 (td1+td2) is longer than the clock period tCK, the monitor D is output during the time corresponding to the time exceeding the clock period tCK. That is the residual of the time corresponding to the quotient of the sum of the delay time of the clock driver 4 and that of the input dummy 5 divided by the clock period tCK to end the signal in the delay circuit chain 1 is used for measurement. That is, clock skew may be removed even if the sum of the delay time td1 of the clock driver 4 and the delay time td2 of the input dummy 5 is longer than the clock period tCK.

In the timing chart shown in FIG. 18, the monitor signal D which ends the progress of the clock signals monitors the time period during which the clock pulses are traveling through the clock driver 4. The timing of passage through the clock driver 4 is quickened by tCK−(td1+td2) as from the time of clock synchronization.

Therefore, when switching from pre-synchronization to post-synchronization, the monitor signal D is output twice during one clock period. In the timing chart of FIG. 18, a monitor signal D shown by hatching and a subsequent signal thereof are outputted. This can be evaded by methods such as (i) by halting the monitor signal at the timing shown hatched in FIG. 18; or (ii) by switching the clock path for halting the progress of pulses to the clock driver 4, after first outputting the internal clock 7 or after outputting the first monitor signal D.

That is, with the second embodiment of the present invention, a monitor signal D directly preceding the monitor signal D to be ceased, shown by hatching at D in FIG. 1(C) in the first embodiment shown in FIG. 1, is ended.

In the second embodiment, the internal clock not freed of skew is output only once, such that the clock skew can be removed at a faster timing than with the above-described first embodiment.

The second embodiment of the present invention is explained in detail hereinbelow.

EXAMPLE 5

Figure 19:
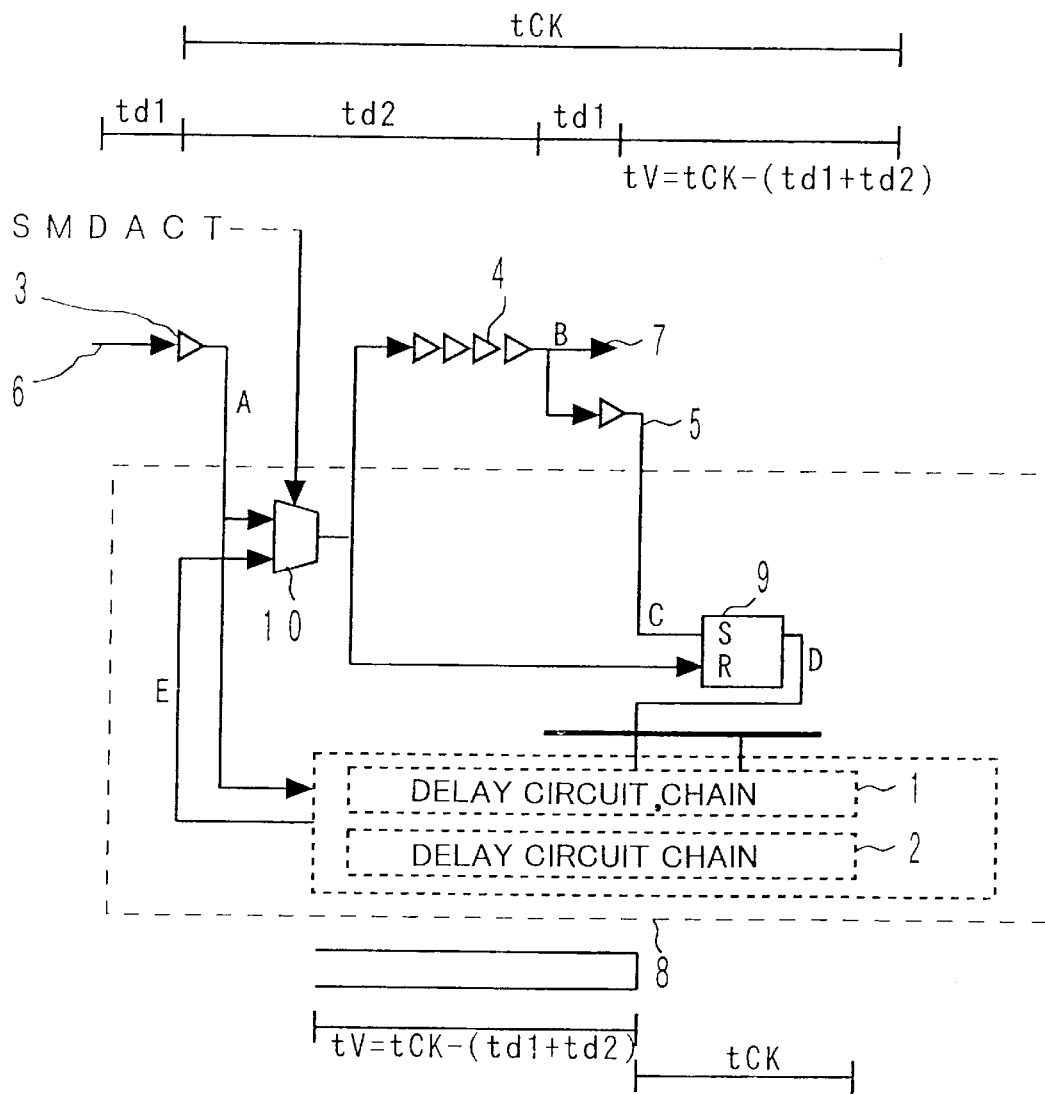
FIG. 19 shows a circuit structure of a fifth example of the present invention.
Figure 20:
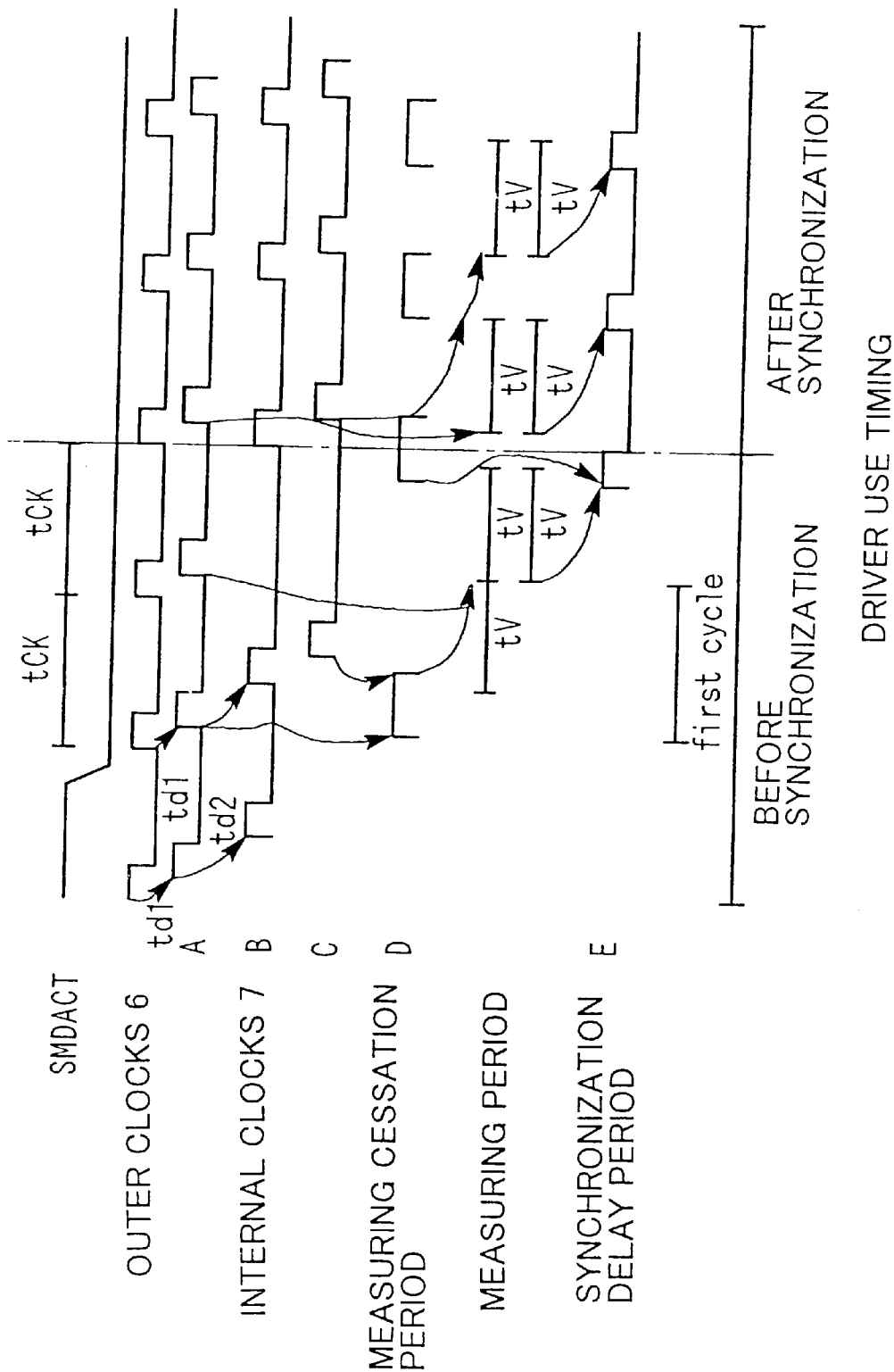
FIG. 20 is a timing chart for illustrating the operation of the fifth example.

FIG. 19 shows the fifth example of the present invention. FIG. 20 shows a timing chart for illustrating the operation of the fifth example. Referring to FIG. 19, the specific circuit structure of the delay circuits 1 and 2 are similar to that of each of the first to fourth examples.

In the preset example, switching of the clock paths is performed by an external signal SMDACT entering the switching circuit 10 as a switching control signal. In FIG. 20, after SMDACT is set to the low level and the operating mode is initiated, the external clock signal 6 is allowed to pass through a path from the input buffer 3 through the switch 10 to the clock driver 4. An output of the clock driver 4 is once supplied as an internal clock 7, after which the pulse path from the input buffer 3 to the clock driver 4 is switched to the pulse path to the delay circuit chain 1. This generates the monitor signal D without waste.

Although the delay circuit chains 1, 2 are shown linearly, these may be arranged in a circular ring, as shown in JP Patent Kokai JP-A-8-237091, to cause rotation of the clock signals to permit the number of revolutions by a counter. This can be applied to all of the different forms of the delay circuits used in the first to fourth examples.

Embodiment 3

Figure 21:
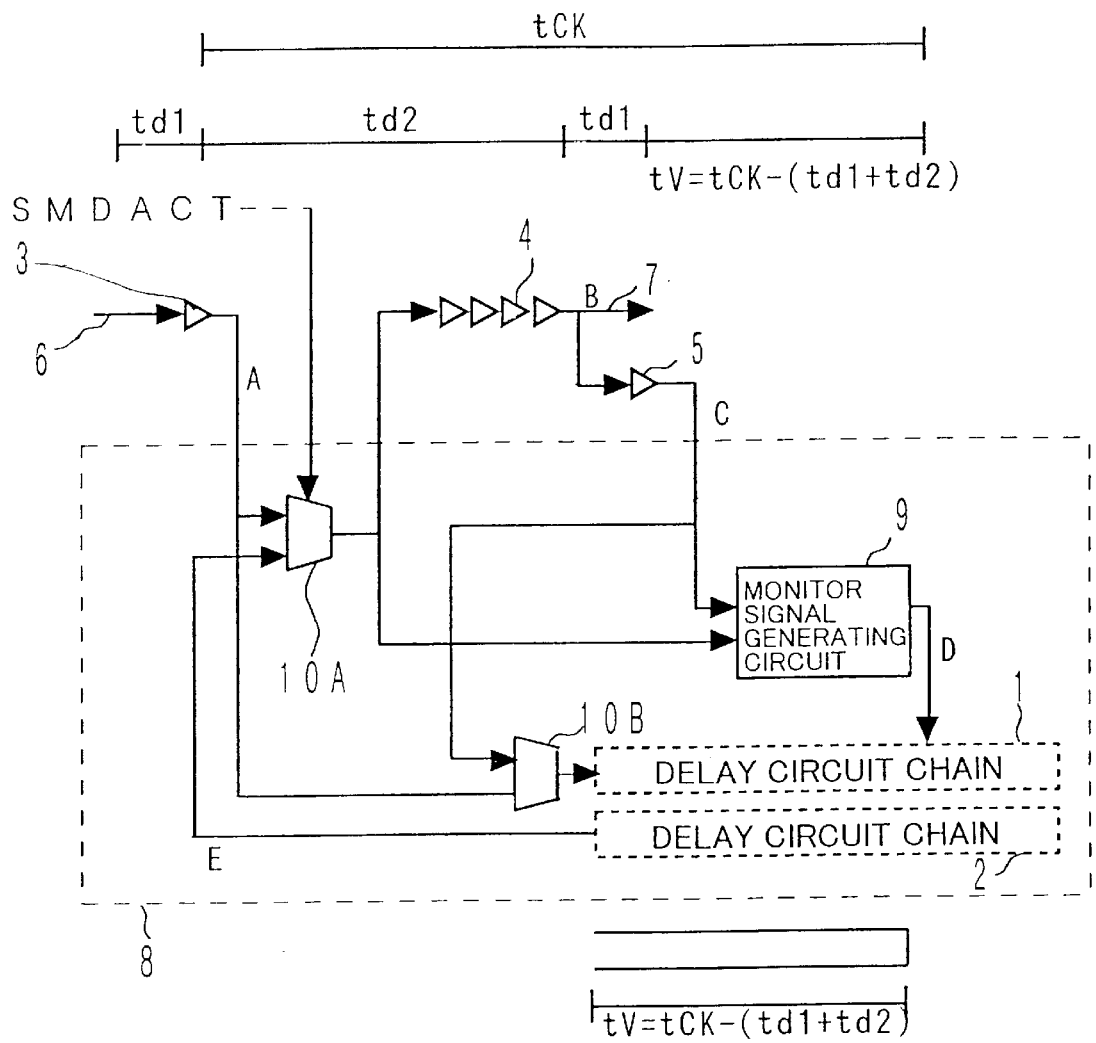
FIG. 21 shows a structure of a third embodiment (sixth example) of the present invention.
Figure 22:
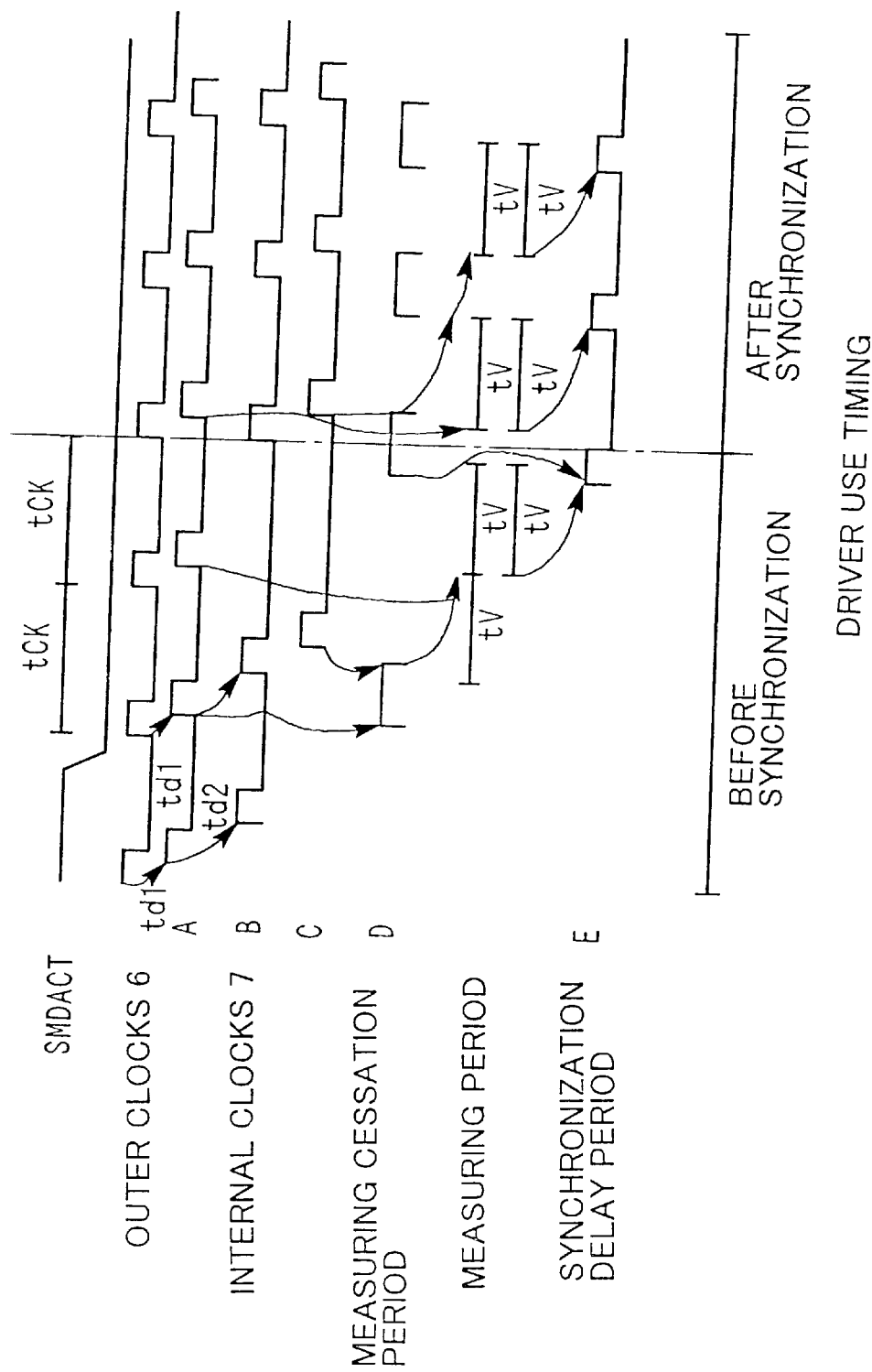
FIG. 22 is a timing chart for illustrating the operation of the third embodiment of the present invention.

FIG. 21 shows the structure of a third embodiment of the present invention and FIG. 22 shows a timing chart for illustrating the operation of the third embodiment of the present invention. Referring to FIG. 21, the present third embodiment includes a synchronous delay circuit made up of a delay circuit chain 1 for estimating a pre-set time interval and a delay circuit chain 2 for reproducing the estimated delay time. The present third embodiment also includes an input buffer 3, a clock driver 4, an input buffer dummy 5, a monitor signal generating circuit 9 and first and second switches (changeover units) 10A, 10B.

The first switch 10A switches between an output of the input buffer 3 and an output of the delay circuit chain 2 used for delay reproduction by the control signal SMDACT to send the selected signal to the clock driver 4 and to the monitor signal generating circuit 9. The second switch 10B is fed with an output of the input buffer 3 and an output of the input buffer dummy 5 to send one of the outputs to an input of the delay circuit chain 1 used for clock period measurement.

The clock period is measured by allowing the clock signals to pass through the delay circuit chain 1 used for measuring the clock period. However, during the time clock skew is likely to be produced, as when the clocked pulses are traveling through the clock driver 4 or when the clocked pulses are traveling through the input buffer dummy 5, passage of clock signals through the delay circuit chain 1 is inhibited to discontinue the measurement of the clock period tCK.

Therefore, the time during which signals are traveling through the delay circuit chain 1 is just equal to the clock period tCK less the sum of the delay time td2 of the input buffer 3 and the delay time td1 of the clock driver tCK−(td1+td2), while the delay time reproduced by the delay circuit chain 2 (synchronous delay time) assumes also tCK−(td1+td2).

The result is that just one clock period tCK is required for the clock pulse to pass through the input buffer 3, delay circuit chain 2 and the clock driver 4 such that the internal clocks 7 are substantially freed of skew with respect to the external clocks.

Also, if, when the circuit for outputting the monitor signal during the time the pulses are traveling through the input buffer 3 and the input buffer dummy 5 by a SR flipflop, the sum of the delay in the clock driver 4 and that in the input buffer dummy 5, (td1+td2), is longer than the clock period tCK, the monitor signal D is output during the time corresponding to the time exceeding the clock period tCK. That is the residual of the time corresponding to the quotient of the sum of the delay time of the clock driver 4 and that of the input driver 3 by the clock period to end the progress of the signal in the delay circuit chain 1 used for measurement. That is, clock skew may be removed even if the sum of the delay time td1 of the clock driver 4 and the delay time td2 of the input dummy 5 is longer than the clock period tCK.

In the timing chart shown in FIG. 18, the monitor signal D which ends the progress of the clock signals monitors the time period during which the clock pulses are traveling through the clock driver 4. The timing of passage through the clock driver 4 is quickened by tCK−(td1+td2) as from the time of clock synchronization.

In a third embodiment of the present invention, the clock signals pass through the input buffer 3, first switch 10A, clock driver 4 and the input dummy 5 before synchronization and are subsequently input to the measurement delay circuit chain 1 through the second switch 10B in order to measure the time of tCK−(td1+td2). Also, the monitor signal D is output at the time of synchronization in order to measure the time of tCK−(td1+td2).

Thus, there is no possibility of the monitor signal D being output twice during one clock period as a result of the switching from the pre-synchronization state to the post-synchronization state as compared to the case of the first and second embodement.

In the third embodiment of the present invention, measurement of the clock period is ended at a signal just ahead of the monitor signal D shown by hatching in FIG. 1c. Thus, with the third embodiment of the present invention, only one internal clock signal not freed of skew is issued so that the clock skew is removed at a timing one period faster than in the first embodiment.

Referring to the drawings, the third embodiment of the present invention will be explained in detail.

EXAMPLE 6

FIG. 21 shows a configuration of the third embodiment of the present invention and FIG. 22 is a timing chart for illustrating the operation thereof.

In the present example, the specified structure of the delay circuit chains 1 and 2 are similar to that of the first to fourth examples described above.

In the present example, the clock path is switched by the external signal SMDACT (by SMDACT going low in FIG. 22) to enter the operating mode and subsequently the external clock signal 6 is once furnished as the internal clock signal 7. The clock signals are then passed from the input buffer 3 to the clock driver 4. The time of tCK−(td1+td2) is measured by the clock pulses passing through the input buffer dummy 5 to enter the delay circuit chain 1 used for measurement. From the next clock signals on, the clock signal path is changed to a path from the input buffer 3 and the second switch 10B which has selected an output of the input buffer 3 through the delay circuit chain 1 for measurement and the delay circuit chain 2 for delay reproduction to the first switch 10A which has selected the output of the input buffer 3 and to the clock driver 4 in order to remove the skew of the external clock 6 and the internal clock 7, that is in order to synchronize the two clocks.

From this time on, the monitor signal D is output to measure the time of tCK−(td1+td2).

Thus, there is no risk of the monitor signal D being output twice by switching from the pre-synchronized state to the post-synchronized state.

Although the delay circuit chains 1 and 2 described above are of a linear configuration, these may also be arranged in a circular ring shape as already shown in JP Patent Kokai JP-A-8-237091, with the clock signals being rotated and the number of revolutions thereof being counted by a counter. This configuration may be applied to all sorts of the delay circuits used in the first to fourth embodiments.

Embodiment 4

Figure 23:
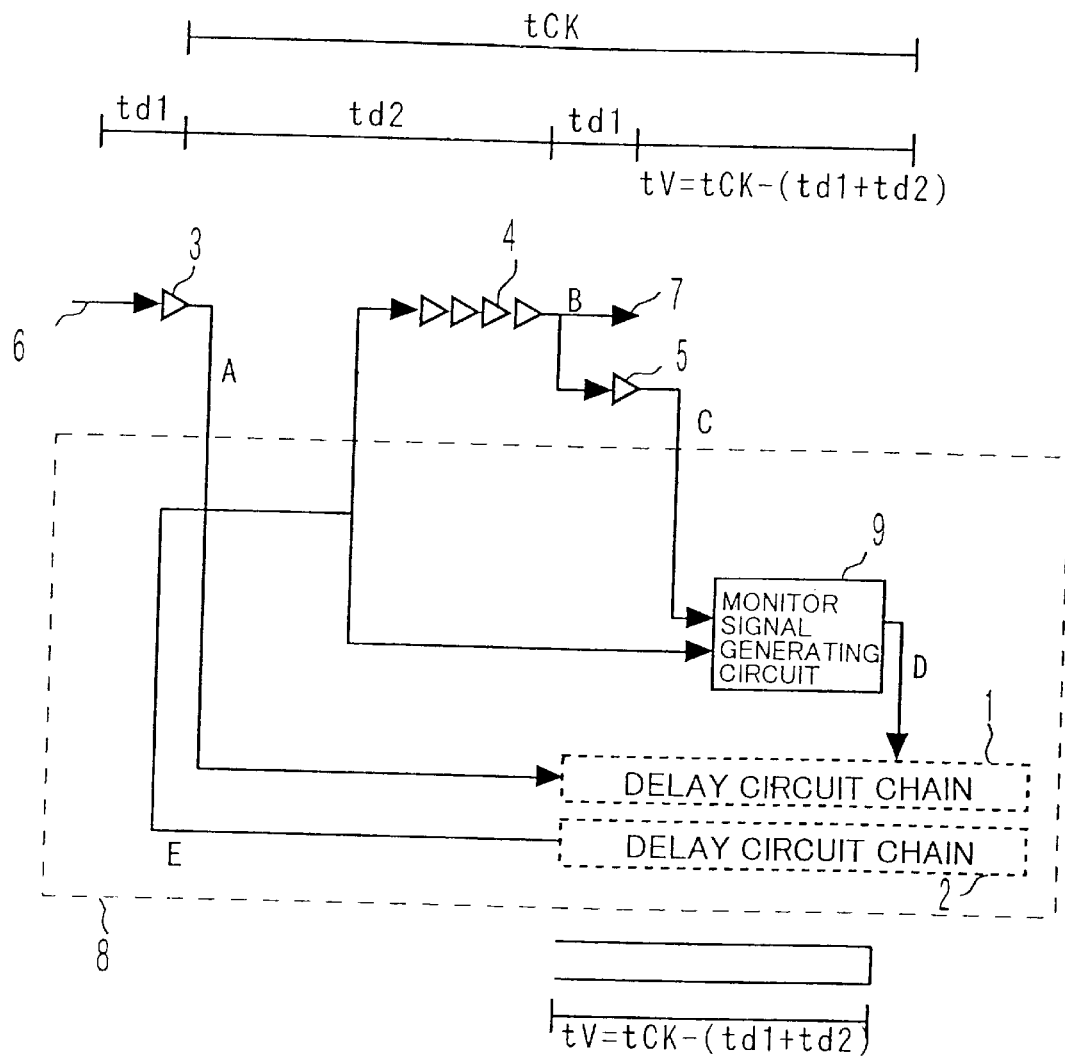
FIG. 23 shows a structure of a fourth embodiment (seventh example) of the present invention.
Figure 24:
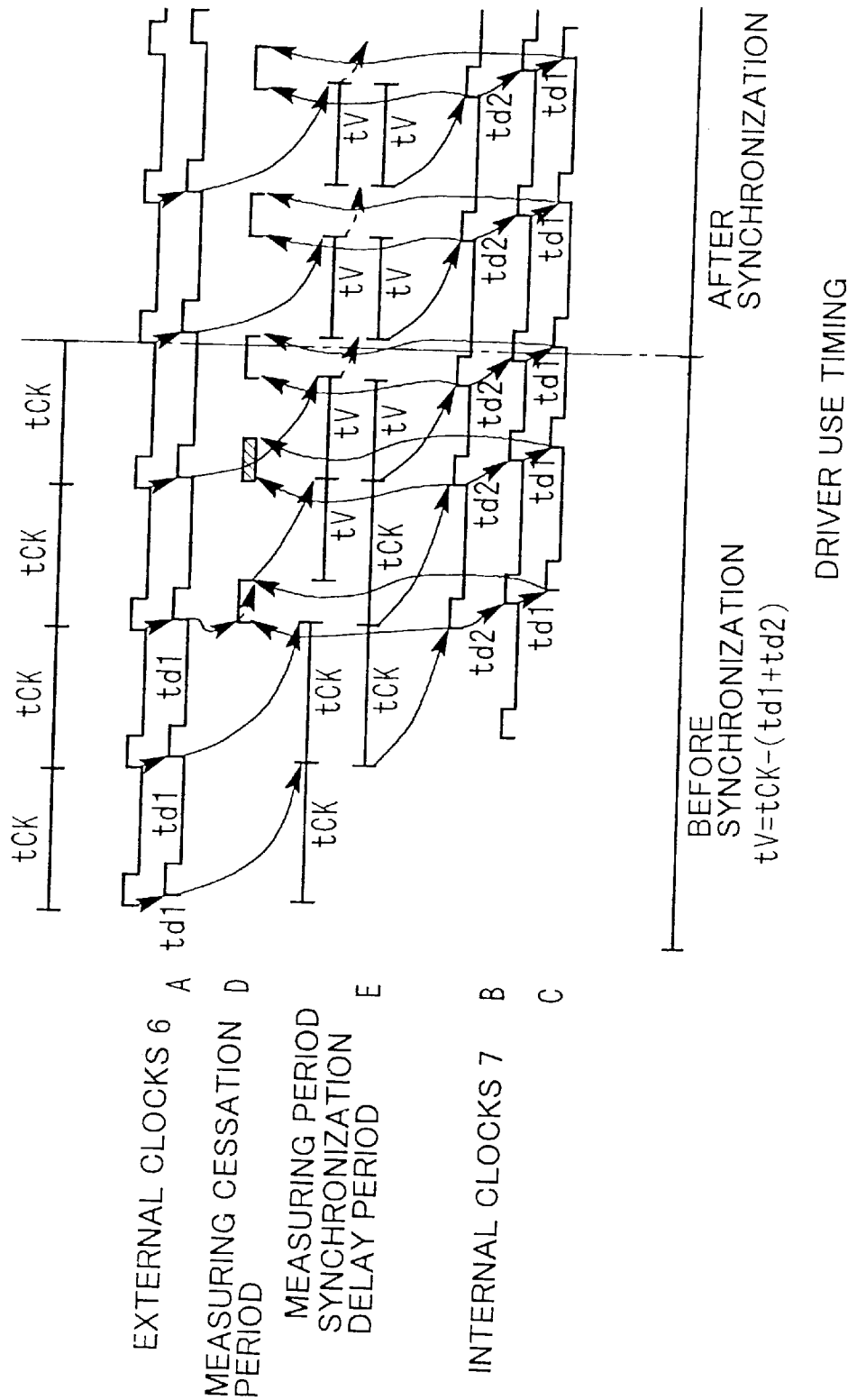
FIG. 24 is a timing chart for illustrating the operation of the fourth embodiment.

FIG. 23 shows the configuration of the fourth embodiment of the present invention and FIG. 24 is a timing chart for illustrating the operation of the fourth embodiment.

Referring to FIG. 23, the fourth embodiment of the present invention includes a synchronous delay circuit made up of a delay circuit chain 1 for measuring a pre-set time and a delay circuit chain 2 for reproducing the measured delay time. The fourth embodiment also includes an input buffer 3, a clock driver 4, an input buffer dummy 5 and a monitor signal generating circuit 9. The clock period is measured by passing the clock signals through the delay circuit chain 1 used for measurement. During the period responsible for clock skew, such as the period during which the clock pulses are travailing through the clock driver 4 or the period during which the clock pulses are traveling through the input buffer dummy 5, the clock signals are prohibited from being passed through the delay circuit chain 1 in order to discontinue the measurement of the clock period tCK.

Thus, the period during which the clock signals traverse the delay circuit chain 1 is just equal to the clock period tCK less the sum of the delay time td2 of the input buffer 3 and the delay time td1 of the clock driver 4, that is tCK−(td1+td2). The delay time reproduced by the delay circuit chain 2 is also equal to tCK−(td1+td2). The result is that just one clock time is required for the clock pulses to pass through the input buffer 3, delay circuit chain 2 and the clock driver 4 such that there is substantially no skew with respect to the external clocks.

If the circuit 9 for outputting the monitor signal D during the time the clock pulses are traveling through the input buffer 3 and the input buffer dummy 5 is constituted by a SR flipflop, and if the sum of the delay time in the clock driver 4 and that in the input dummy 5 is longer than the clock period tCK, the monitor signal D is output during the time equal to the time exceeding the clock period tCK. That is the residual of the quotient obtained on dividing the sum of the delay time td2 of the input buffer 3 and the delay time td1 of the clock driver 4, (td1+td2), by the clock period tCK, in order to cease the progress of the signal through the delay circuit chain 1 is used for clock period measurement. Thus, it becomes possible to remove the clock skew even if the sum of the delay time of the input buffer and the delay time of the clock driver is longer than the clock period tCK.

In the timing chart shown in FIG. 24, the monitor signal D, which ends the progress of the clock signals, monitors the time period during which the clock pulses are passing through the clock driver 4, so that the timing of travel of the clock signals through the clock driver 4 is quickened by tCK−(td1+td2).

In the fourth embodiment of the present invention, the clock signals are passed at all times through the input buffer 3, delay circuit chains 1 and 2, clock driver 4 and the input buffer dummy 5. Thus, before synchronization, the clock signals subsequently enter the delay circuit chain 1 for measurement in order to measure and reproduce the clock period tCK, whereas, during synchronization, the clock signals cause the monitor signal D to be output in order to measure the time tCK−(td1+td2).

By this reason, there are occasions wherein, as in the first and second embodiments, described above, the monitor signal may be output twice during one period by switching from the pre-synchronization state to the post-synchronization state, as in the first and second embodiments described above. It is noted that the measures used in the first and second embodiments for preventing outputting of the monitor signal D twice may be used as in the fourth embodiment of the present invention.

In the fourth embodiment of the present invention, since it is unnecessary to change the clock path, the clock path (wiring length) can be reduced to render it possible to handle clock signals of a shorter period and a higher frequency.

Reference is had to the drawings for explaining the fourth embodiment of the present invention in further detail.

EXAMPLE 7

FIG. 23 shows the configuration of the fourth embodiment of the present invention and FIG. 24 is a timing chart for illustrating the operation of the fourth embodiment.

Referring to FIG. 23, the present embodiment again has delay circuit chains 1 and 2, the specified circuit structure of which is similar to that of the above-described first to fourth examples.

In the present example, clock signals are passed at all times through an input buffer 3, delay circuit chains 1 and 2, clock driver 4 and the input buffer dummy 5. Thus, in the present embodiment, a clock monitor signal D is generated after the synchronization operation mode is entered. The internal clocks free of clock skew are generated by measuring the time of tCK−(td1+td2) by the delay circuit chain 1 and by reproducing the time of tCK−(td1+td2) by the delay circuit chain 2.

In the present example, the delay circuit chain 1 is not in operation with the second clock monitor signal D or a clock monitor signal D following the second clock monitor signal D after a first clock monitor signal D is generated (monitor signal shown by hatching in FIG. 24). This evades the monitor signal D acting twice on the delay circuit chain 1 during one period to generate tCK−(td1+td2) at all times.

In the preset embodiment, the delay circuit chains 1, 2 are not limited to the linear array of delay elements. For example, these delay elements may also be arrayed in a ring so that the clock signals are rotated and the number of times of rotation may be counted by a counter. In this case, the delay circuits used in the first to fourth embodiments may be used without limitations.

Embodiment 5

Figure 25:
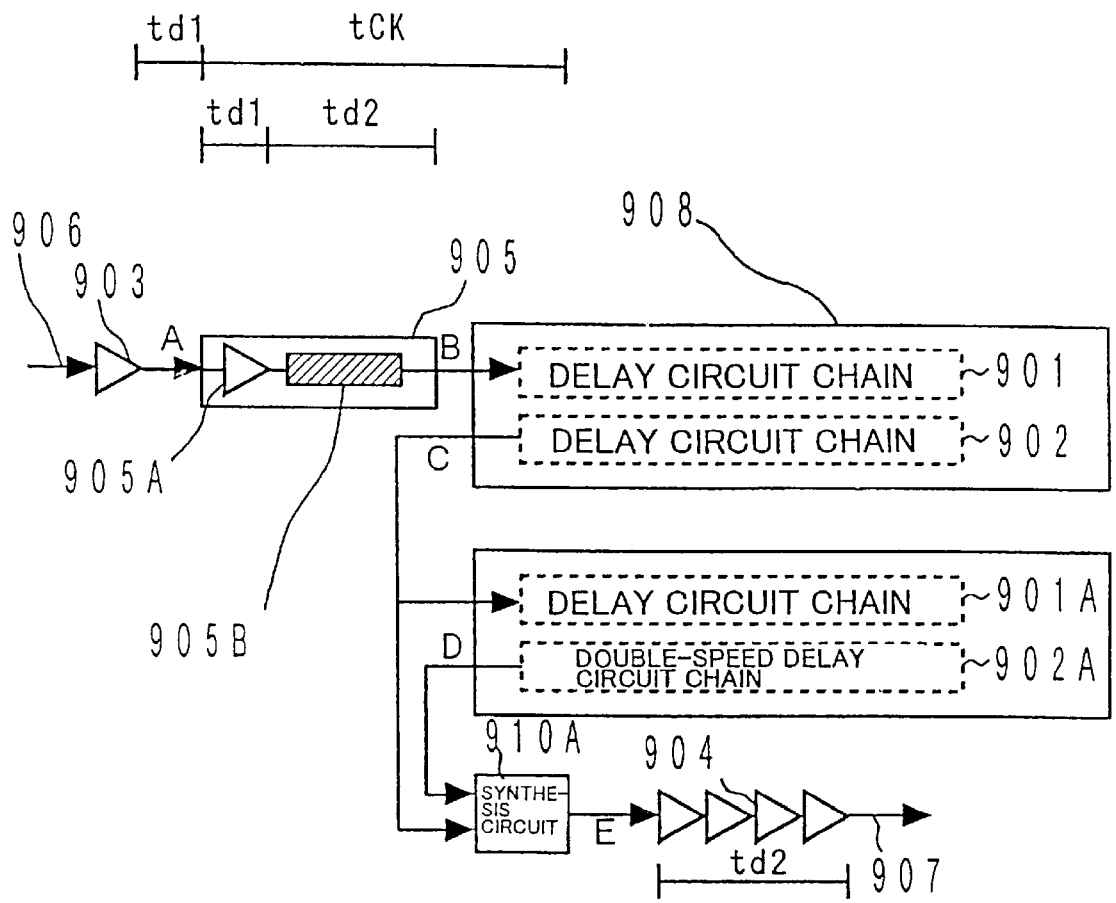
FIG. 25 shows a structure of a synchronous delay circuit for generating internal clocks of the double frequency and Duty50.
Figure 26:
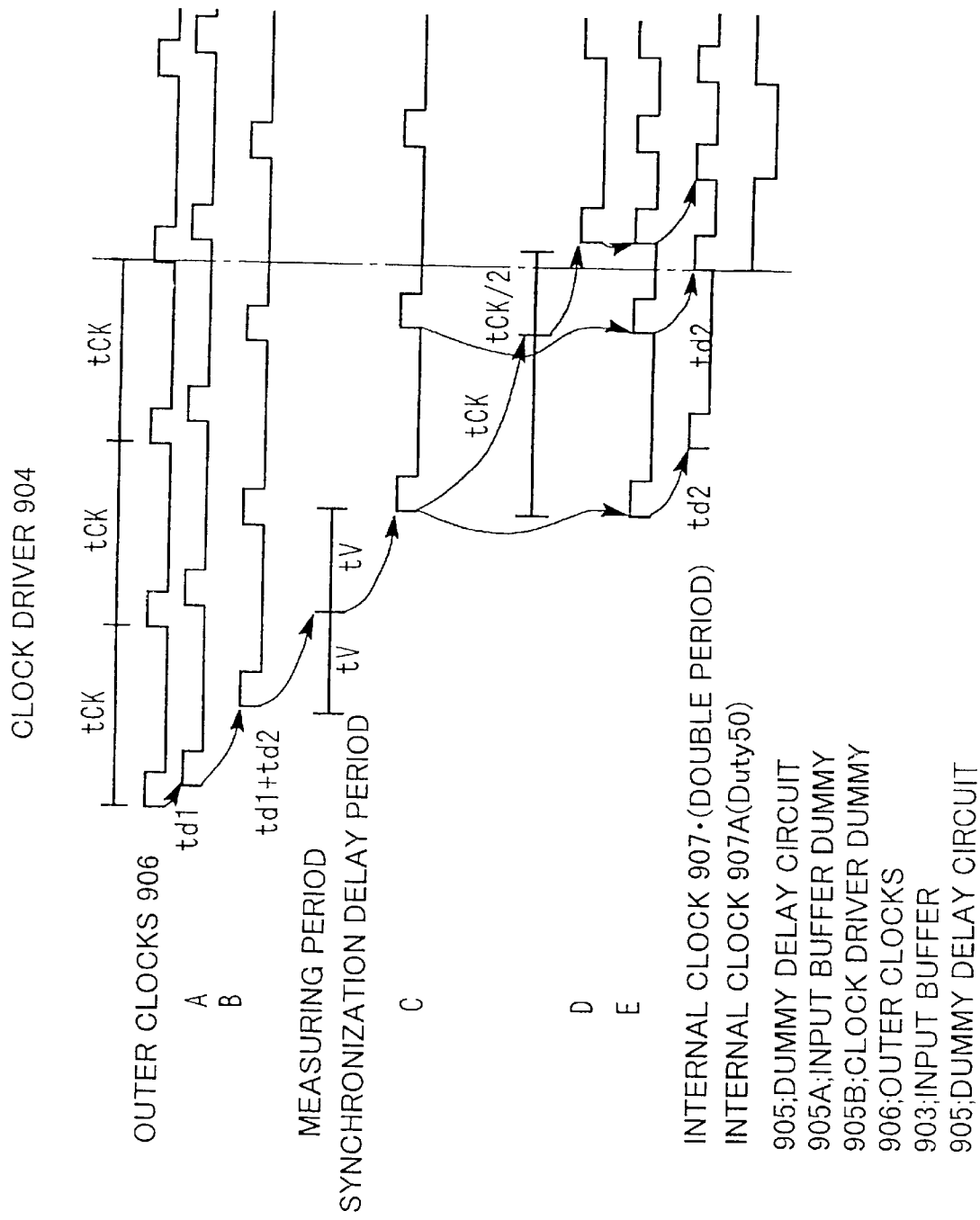
FIG. 26 is a timing chart for illustrating the operation of the synchronous delay circuit shown in FIG. 25.

As already explained with reference to FIGS. 25 and 26, in the conventional circuit constituting the double frequency and Duty50 generating circuit by the synchronous delay circuit, the double frequency internal clocks freed of clock skew and Duty50 clocks can be produced with the two clock periods for removing clock skew and 1.5 periods for the double frequency and the Duty50. However, with this conventional internal delay circuit, the removal of clock skew and the double frequency with Duty50 are achieved by two clock periods and 1.5 clock period in series, 3.5 clocks (3.5 tCK) are required for skew removal.

Figure 27:
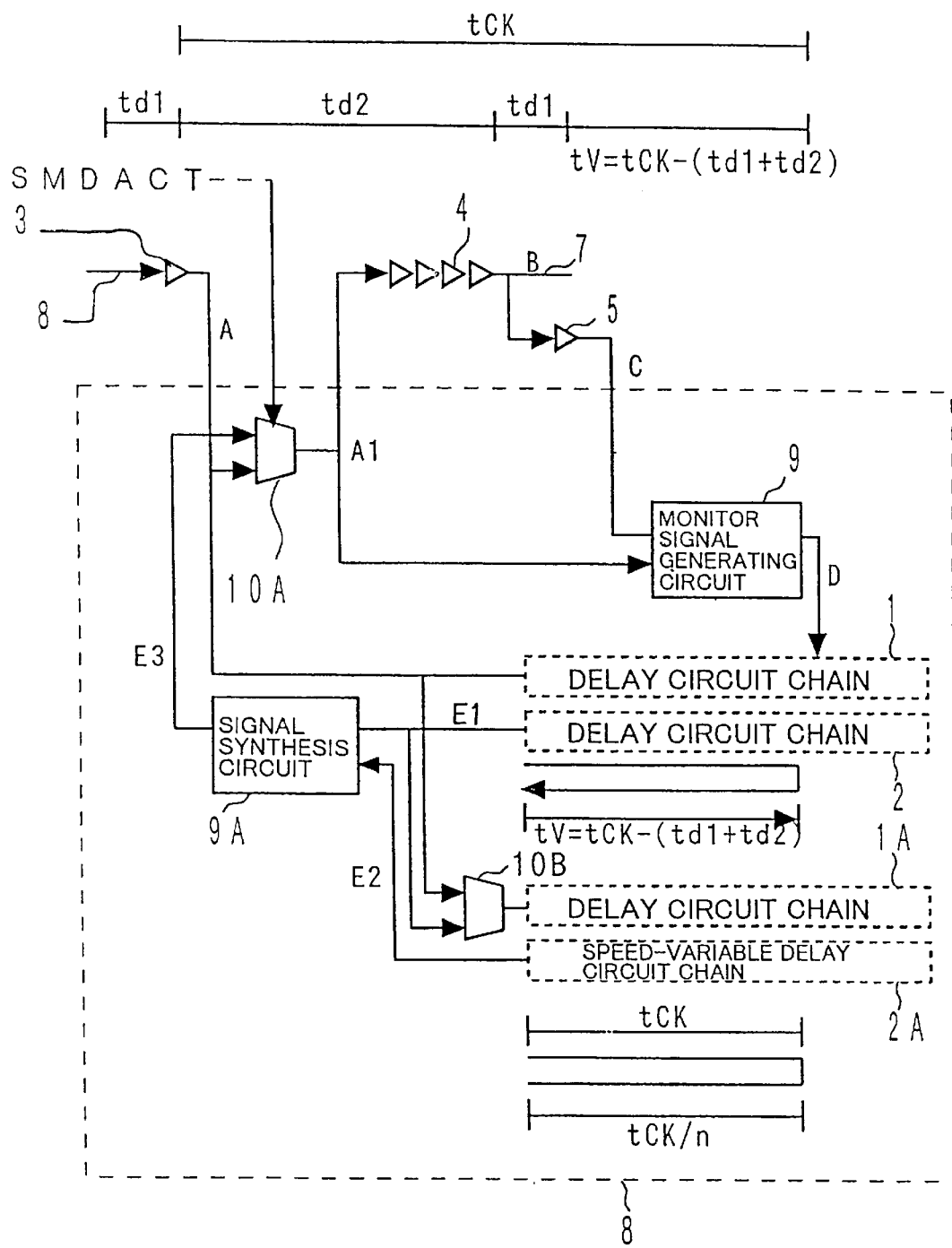
FIG. 27 shows the structure of the fourth embodiment (eighth example) of the present invention.
Figure 28:
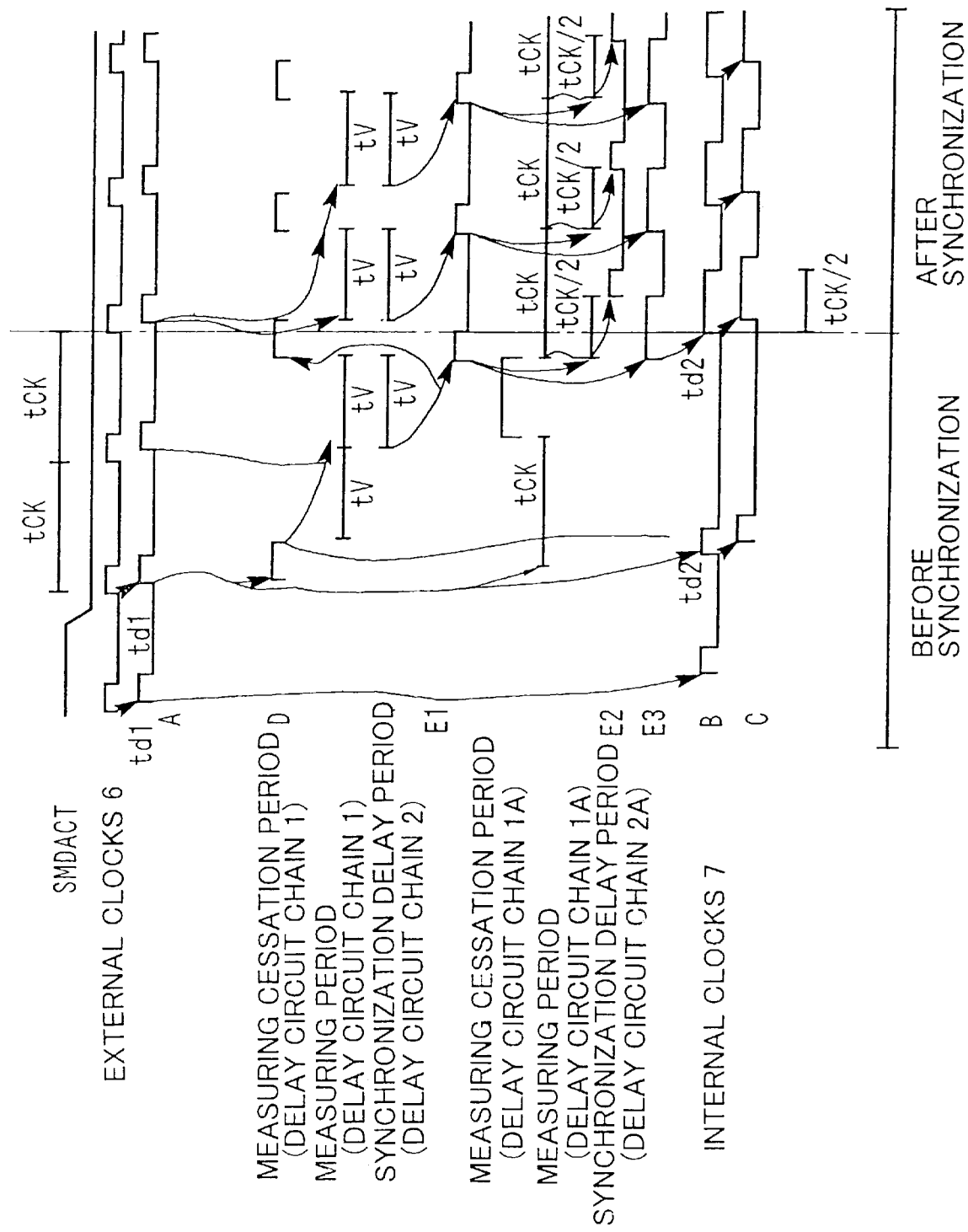
FIG. 28 is a timing chart for illustrating the fourth embodiment of the present invention.

FIG. 27 shows the structure of the fifth embodiment of the present invention. FIG. 28 is a timing chart for illustrating the operation of the fifth embodiment of the present invention.

Referring to FIG. 27, the fifth embodiment of the present invention includes, in addition to the input buffer 3, first switch 10A, clock driver 4, input dummy 5, monitor signal generating circuit 9 and the circuit configuration for skew removal comprised of the synchronous delay circuit made up of the delay circuit chain 1 for clock period measurement and the delay circuit chain 2 for clock period reproduction, a delay circuit chain 1A for measuring the pre-set time, a speed variable delay circuit chain 2A for reproducing the delay time proportionate to the measured delay time, a second switch 10B and a synthesis circuit 9A.

An output (A) of the input buffer 3 and an output (E1) of the delay circuit chain 2 for clock period reproduction are input to the second switch 10B, an output of which is coupled to the delay circuit chain 1A used for measuring the pre-set time.

An output of the delay circuit chain 2 and the speed variable delay circuit chain 2A for reproducing the delay time is input to the signal synthesis circuit 9A, an output of which is input to the first switch 10A. An output of the first switch 10A is sent to the clock driver 4 and the monitor signal generating circuit 9.

The clock period is measured by passing the clock signals through the delay circuit chain 1A used for measuring clock periods. First, the clock periods are measured by an output of the input buffer 3 and when the signal E1 is output from the delay circuit chain 2 for period reproduction, the clock period is measured with the signal from the delay circuit chain 2.

The speed variable delay circuit chain 2A adapted for reproducing the delay time proportionate to the measured delay time reproduces the delay time proportionate to the measured delay time no matter whether the delay circuit chain 1A used for measuring the period has measured the clock period by a signal from the delay circuit chain 2 selected by the second switch 10B or an output of the input buffer 3. The speed variable delay circuit chain 2A controls the output by the signal from the delay circuit chain 2. There is produced at this time a time difference during which the measurement of the clock period tCK is discontinued.

Thus, before outputting of the clock substantially free of skew with respect to the external clocks by the delay circuit chains 1 and 2 explained with reference to the above-described first to third embodiments, the clock period can be measured by the delay circuit chain 1A, so that, when the clocks free of skew are output by the delay circuit chain 2, the generated clocks can be immediately passed through the delay circuit chain 2A having the delay proportionate to the clock period.

Thus, by synthesizing an output of the delay circuit chain 2 and an output of the delay circuit chain 2A by the signal synthesis circuit 9A, it is possible to obtain internal clocks of the double frequency and Duty50 clocks substantially free from the external clocks 6 by synthesizing an output of the delay circuit chain 2 and the delay circuit chain 2A.

Reference is had to the drawings for illustrating the fifth embodiment of the present invention.

EXAMPLE 8

FIG. 27 shows the structure of an eighth example of the present invention and FIG. 28 shows a timing chart for illustrating the operation of the eighth embodiment. Referring to FIG. 27, the specified circuits of the delay circuit chains 1 and 2 and the delay circuit chains 1A and 2A can be configured similarly to those of the above-described first to fourth embodiments.

The delay time of the delay circuit chain 2A for period reproduction is just a half that of the delay circuit chain 1A for period measurement. The delay circuits of the period delay circuit chain 2A may be implemented by the number of elements, difference in driving capability and in delay time difference. Several examples of the circuit configuration are shown in FIGS. 29 to 32.

Figure 29:
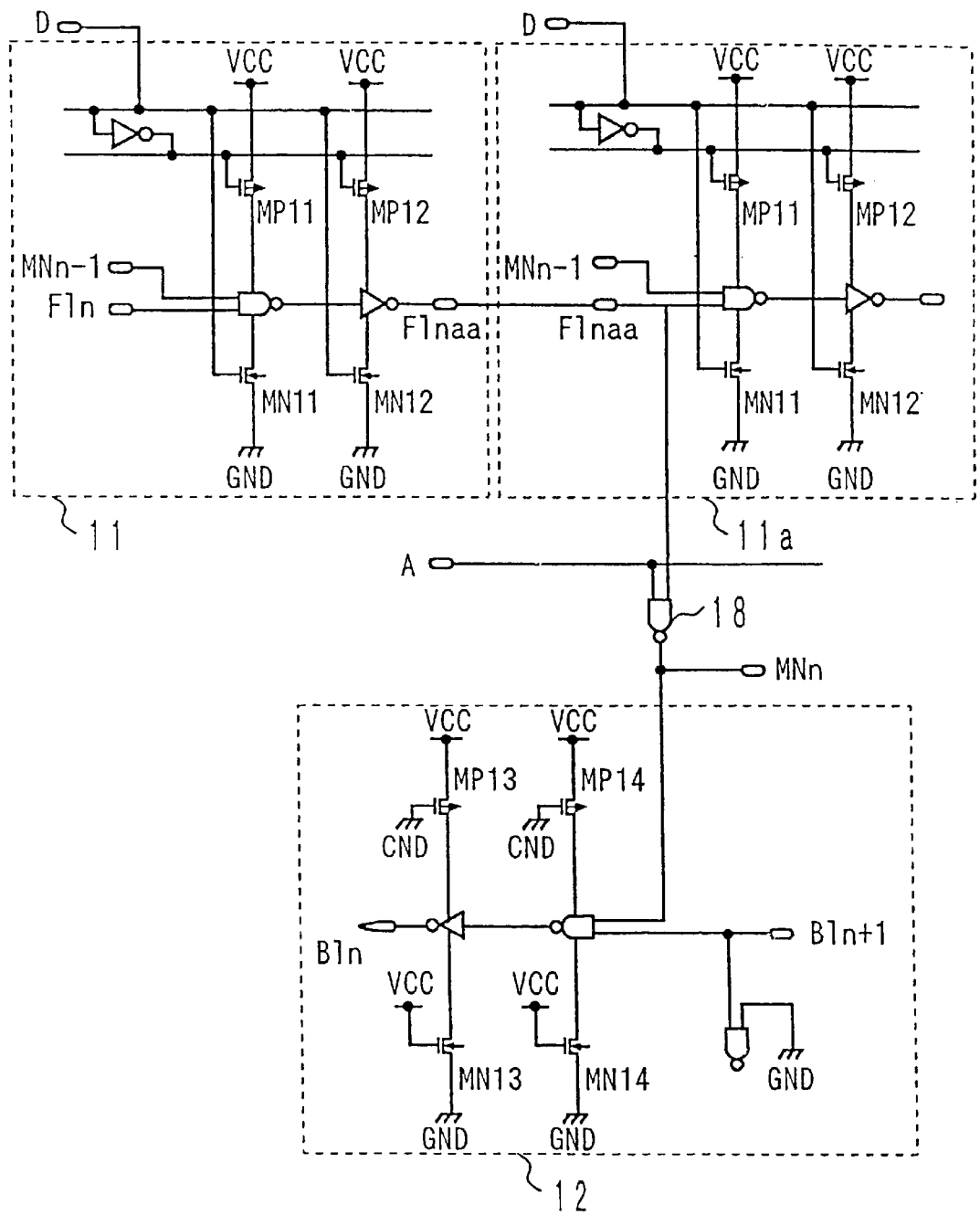
FIG. 29 shows an example of the structure of a delay circuit chain in the fourth embodiment of the present invention.

Referring to FIG. 29, the circuit of the eighth embodiment includes a delay circuit chain 11 for measurement, a control circuit 18 for controlling the transfer to a delay circuit chain 12 for delay reproduction of clocks propagated through the delay circuit chain 11 and the delay circuit chain 12. The number of elements (delay elements made up of NANDs and inverters) per stage is equal to that of the delay circuit chain 12. Thus, the delay time of the delay circuit chain 12 for period reproduction is just a half of that of the delay circuit chain 11 for period measurement. Meanwhile, the delay circuits of the delay circuit chain 11 are configured for turning PMOS and NMOS transistors on and off based on the monitor signal D for controlling the on/off state of the NMOS transistors for controlling the active/inactive states of the delay circuits (NAND circuits and inverter circuits). The delay circuits of the delay circuit chain 12 are activated at all times.

Figure 30:
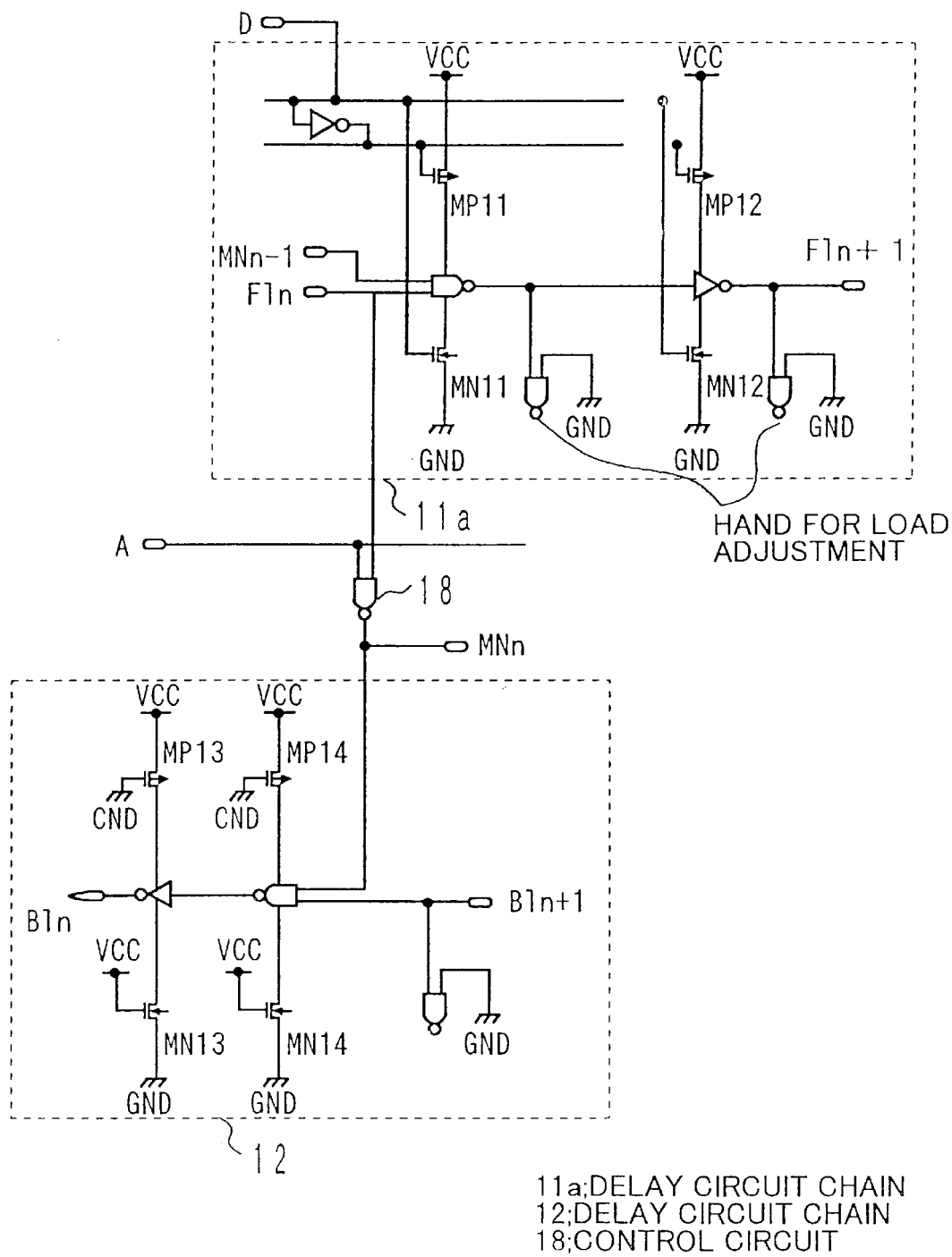
FIG. 30 shows a typical structure of a delay circuit chain in the fourth embodiment of the present invention.

In FIG. 30, the number of loads of the delay circuits of the delay circuit chain 12 (NANDs for load adjustment) per stage is set to twice as many as that of the delay circuit chain 12.

Figure 31:
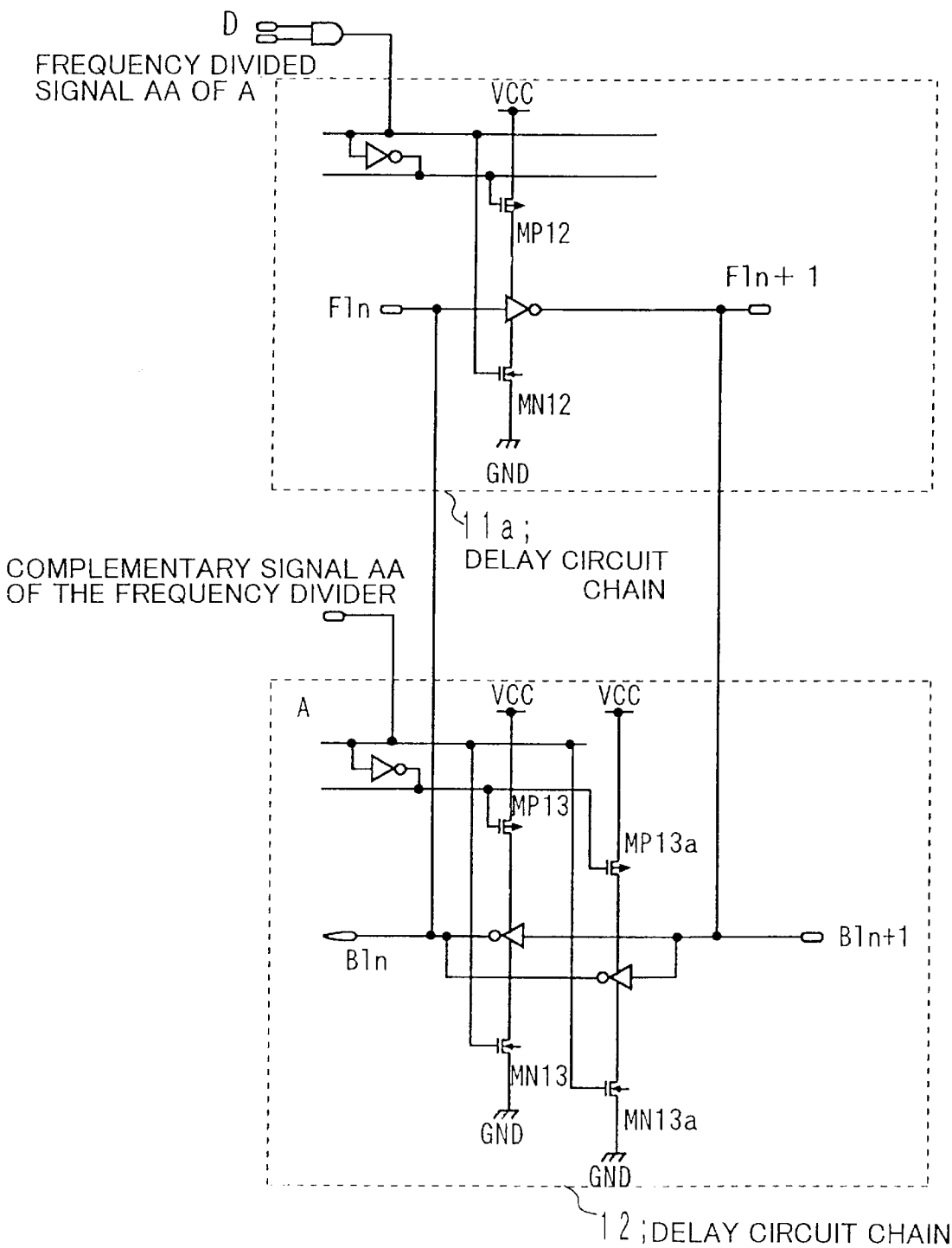
FIG. 31 shows another typical structure of the delay circuit chain in the fourth embodiment of the present invention.

In FIG. 31, the driving capability per stage of the delay circuits of the delay circuit chain 12 is set to double that of the delay circuit chain 11. That is, two clocked inverters are connected in parallel per stage in the delay circuit chain 12. Each clocked inverter of the delay circuit chain 12 has its active or inactive state controlled by a complementary signal of a signal AA adapted for controlling the active or inactive state of the delay circuit chain 11.

Figure 32:
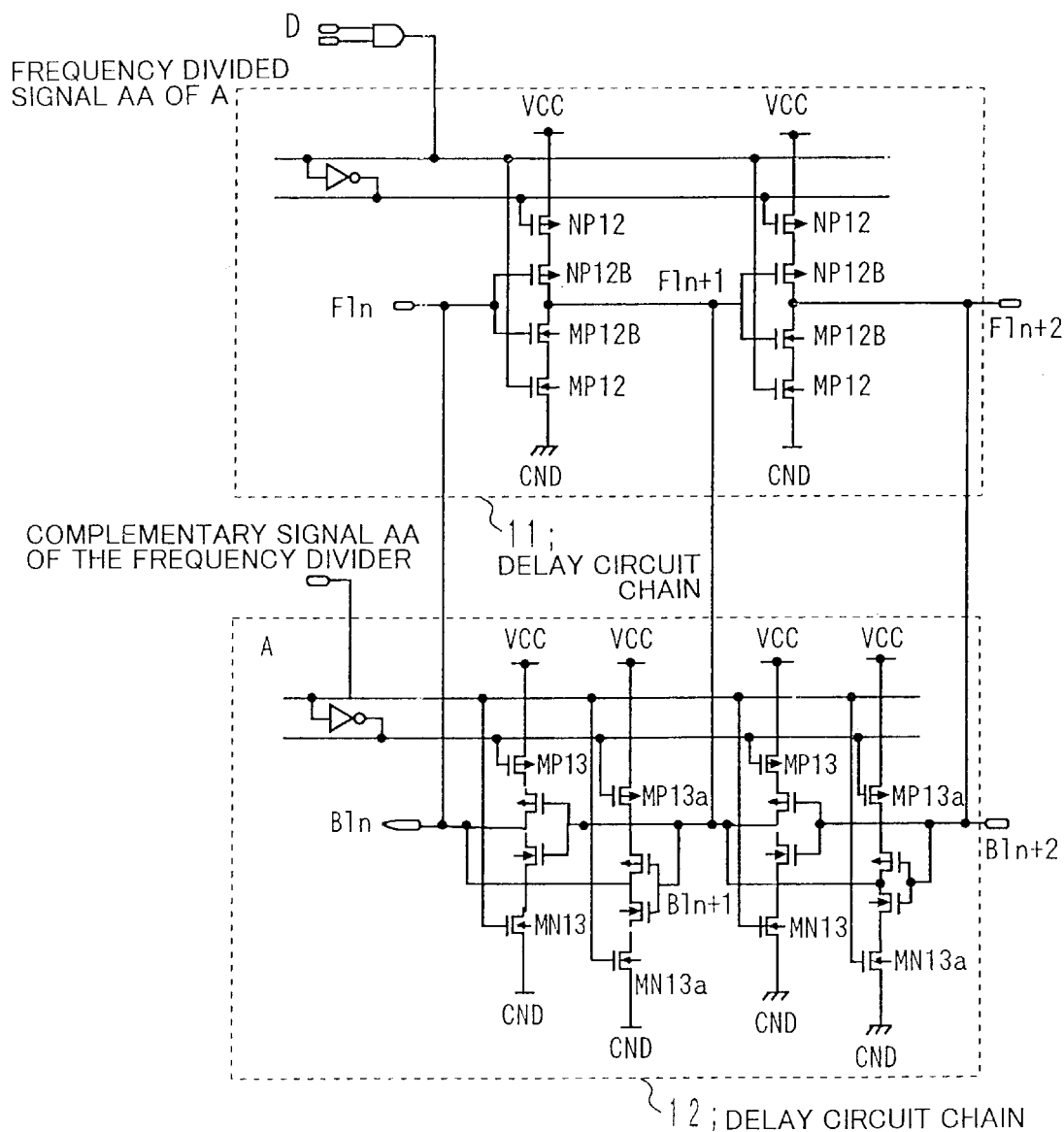
FIG. 32 shows still another typical structure of the delay circuit chain in the fourth embodiment of the present invention.

In FIG. 32, the driving capability per stage of the delay circuits of the delay circuit chain 12 is set to double that of the delay circuit chain 11. The delay circuit chain 11 is made up of two stages of clock inverters per stage of the delay circuit, while the delay circuit chain 12 is made up of two stages of parallel-connected clock inverters per stage of the delay circuit. In FIG. 32, the PMOS and NMOS transistors (such as MP12, MN12) controlling the activation/non-activation of the clocked inverters of the period-measurement delay circuit chain 1 have gate terminals controlled a logical product (AND) output of the monitor signal D and a frequency divided signal AA of a signal A (external clock input) and its inverted value, while the PMOS and NMOS transistors adapted for controlling the activation/non-activation of the clocked inverters of the delay circuit chain 12 for delay reproduction have gate terminals controlled by the complementary signal of the frequency divided signal and its inverted value.

Referring to FIG. 32 again, there is provided a modified embodiment. Namely, PMOS transistors MP12 and MP12B of the first stage clocked inverter and NMOS transistors MN12 and MN12B of the second stage clocked inverter can be eliminated in the delay circuit chain 11 on the one hand. On the other hand, the parallel transistors MP13 and MP13a of the first stage clocked inverter and the parallel transistors MN13, MN13B and MN13C of the second stage clocked inverter can be eliminated. In this case, the clock signals received by the delay circuit chain 11 are driven alternately by PMOS transistors and NMOS transistors in a sequence of Fln-NMOS transistors-Fln+1-PMOS transistor-Fln+2 . . . . Also in the delay circuit chain 12 the PMOS transistors and NMOS transistors are driven likewise alternately. In such an arrangement, the required number of elements is reduced to about a half as compared to the case of FIG. 32. A further modification is also possible. As for the clocked inverters, PMOS and NMOS transistors functioning as switch elements and constituting the CMOS inverter are disposed inside/outside with respect to the power supply Vcc and the ground line GND in FIG. 32. However, these PMOS and NMOS transistors constituting the CMOS inverter may be disposed between the switching element and Vcc, and between the switching element and GND, respectively.

In a further variant, the first and second delay circuit chains, third and fourth delay circuit chains may be made up of delay circuits adapted for separately driving PMOS and NMOS transistors constituting the delay circuit of the delay circuit chains.

Although the single-phase clock signals are entered from outside in the above-described embodiments, it is possible with the present invention to use complementary clock signals as clocks 6 entered from outside and to utilize the rising and falling edges of the complementary clock signals. Since the distance traversed by the clock signals may be half the clock period, the circuit scale may be reduced.

Figure 11:
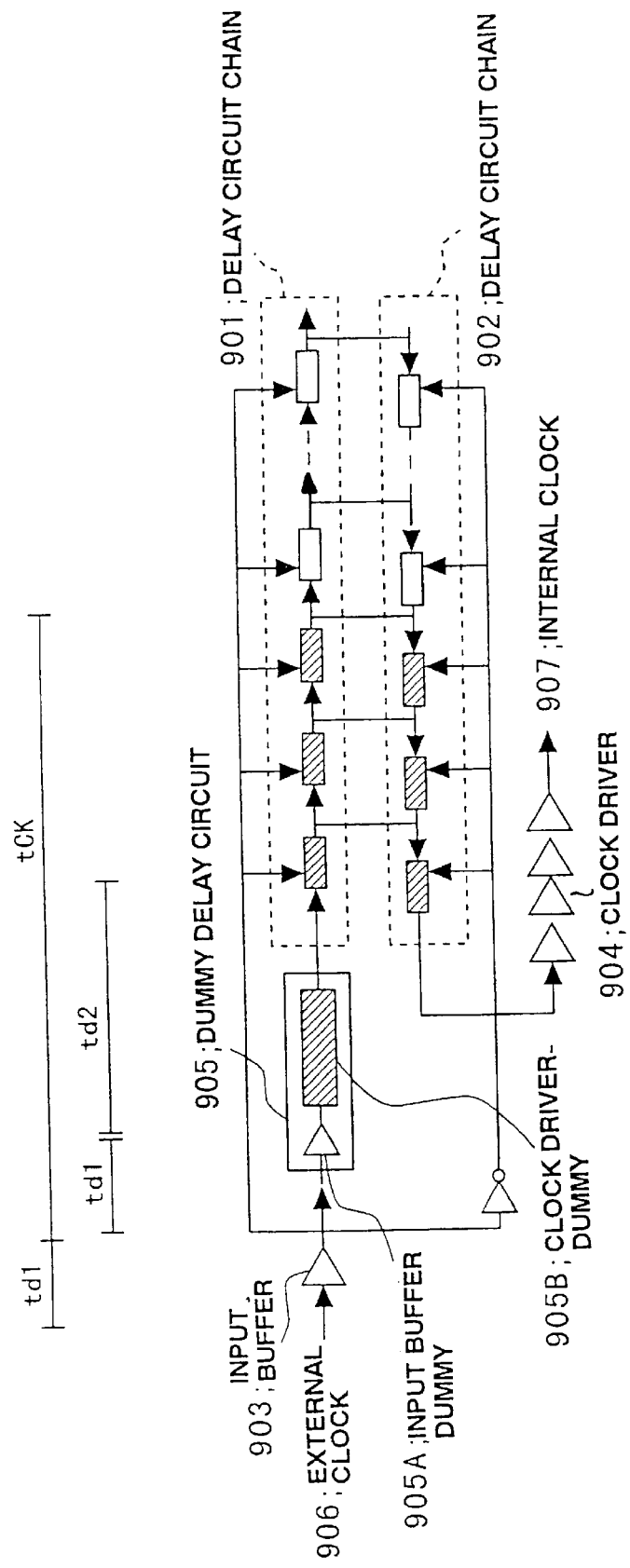
FIG. 11 is a diagram showing a second circuit arrangement according to the prior art.
Figure 13:
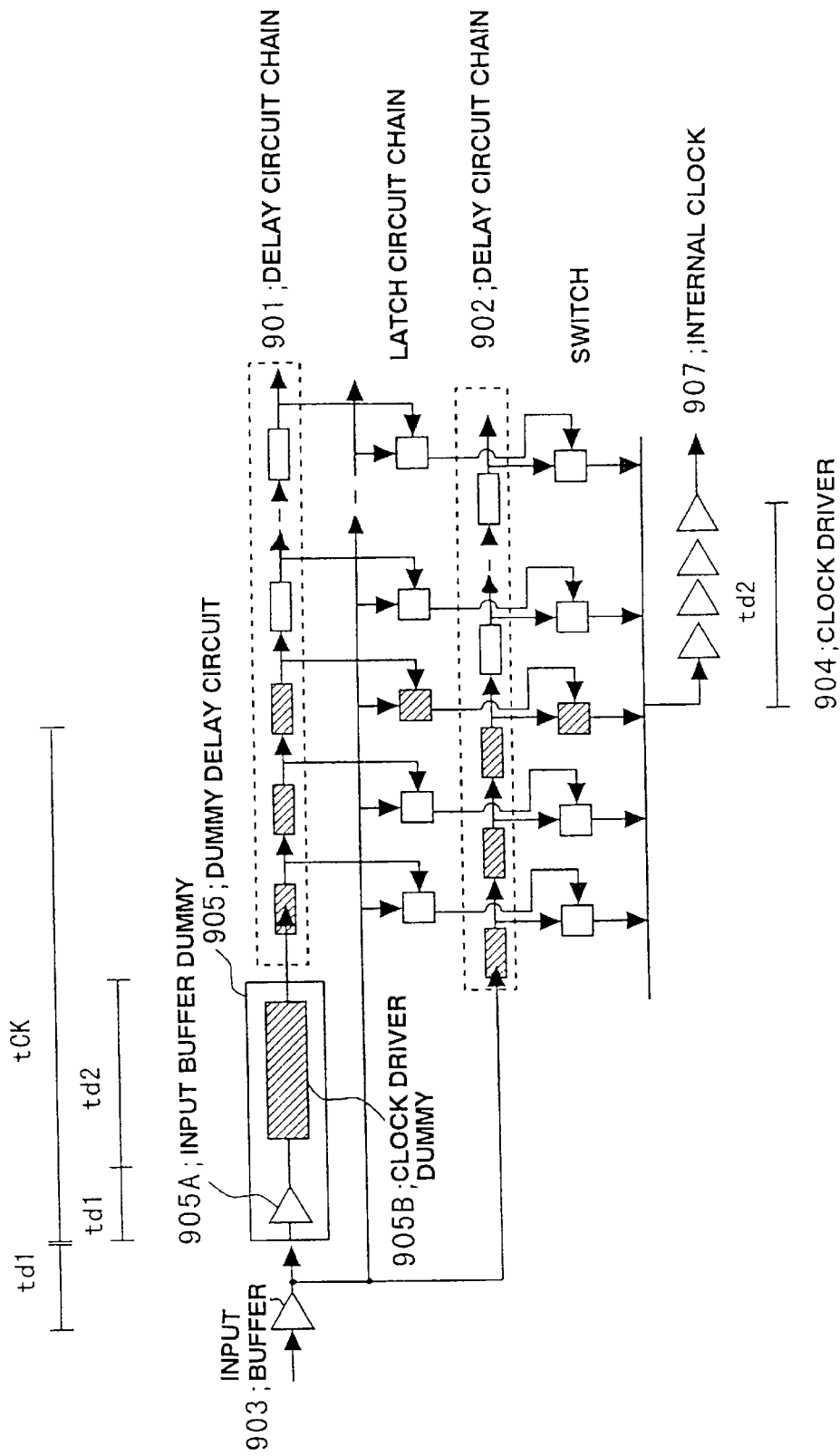
FIG. 13 is a diagram showing a fourth circuit arrangement according to the prior art.
Figure 14:
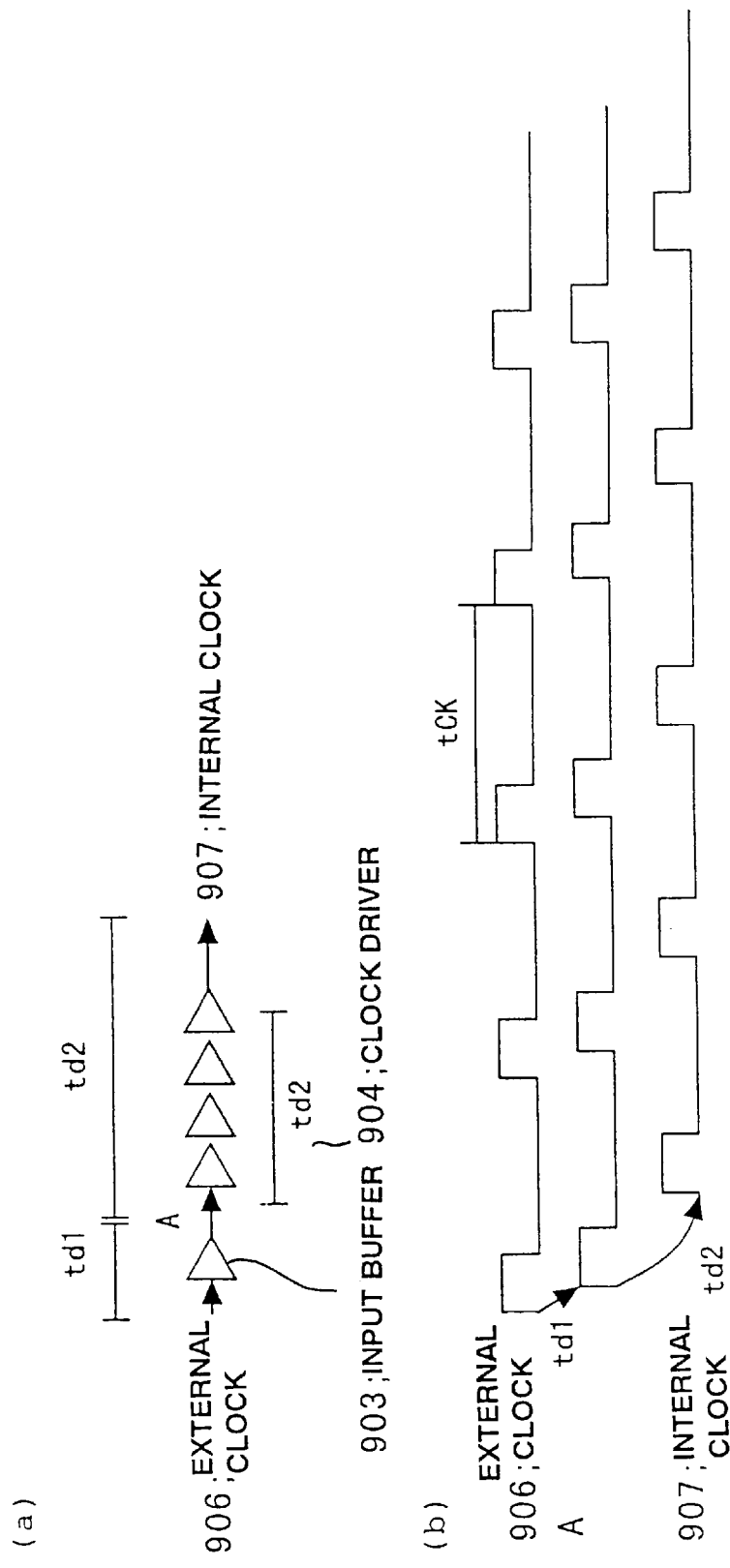
FIG. 14 is a diagram illustrating a circuit arrangement that does not use a synchronous delay circuit, as well as an associated timing chart.
Figure 15:
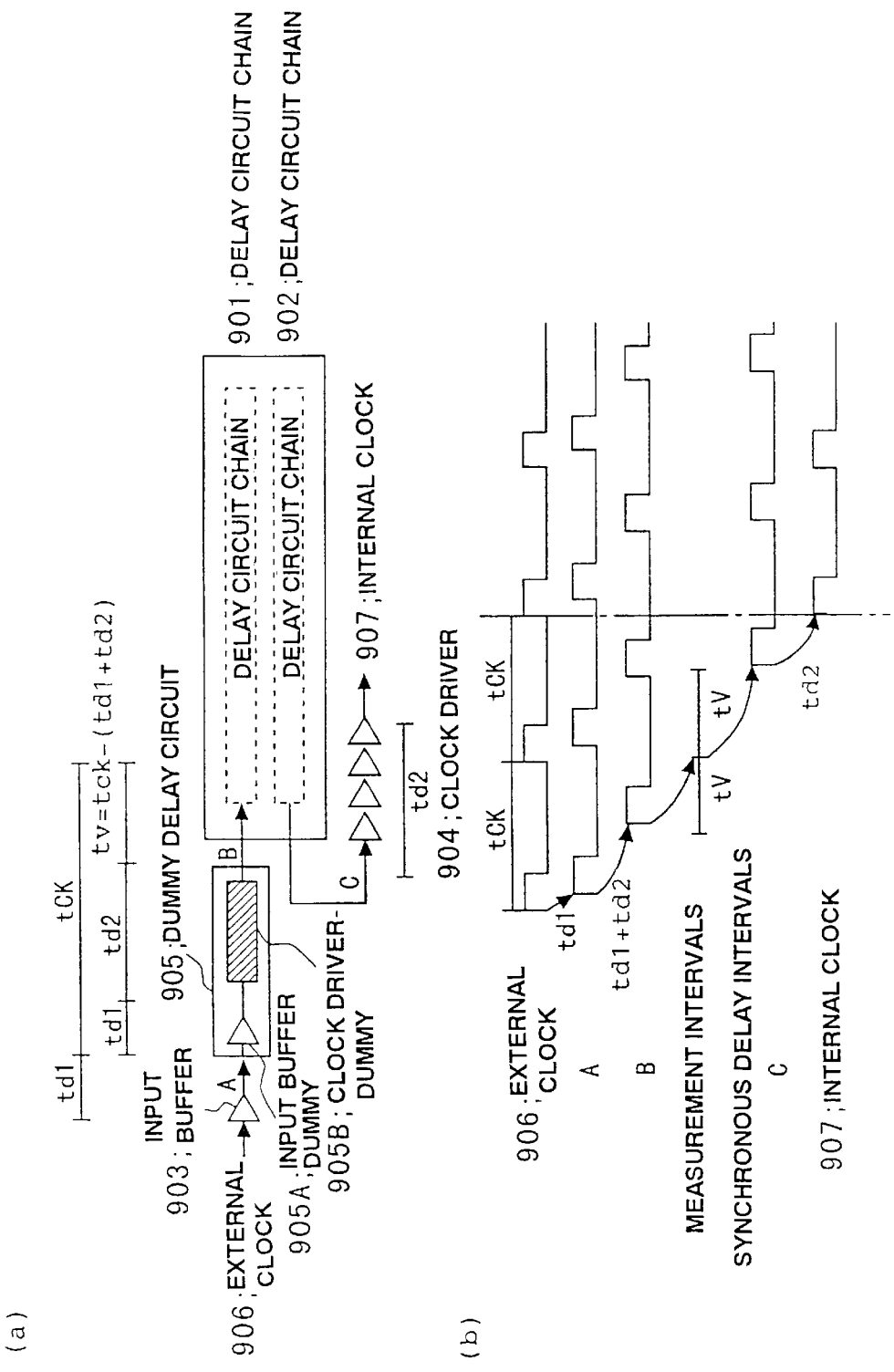
FIG. 15 is a diagram illustrating a circuit arrangement that uses a synchronous delay circuit according to the prior art, as well as an associated timing chart.

In the system shown in FIGS. 11 and 13, pulse edges are used, so that frequency division is required with the single-phase clock input. However, if complementary signals are used, the necessity of frequency division is advantageously eliminated.

It is also possible to increase the effective operating frequency by using complementary clock signals as clocks entered from outside and two sets of circuits in which rising and falling edges of the complementary clock signals are alternately used, with outputs of the circuits being complementary signals.

EXAMPLE 9

Figure 33:
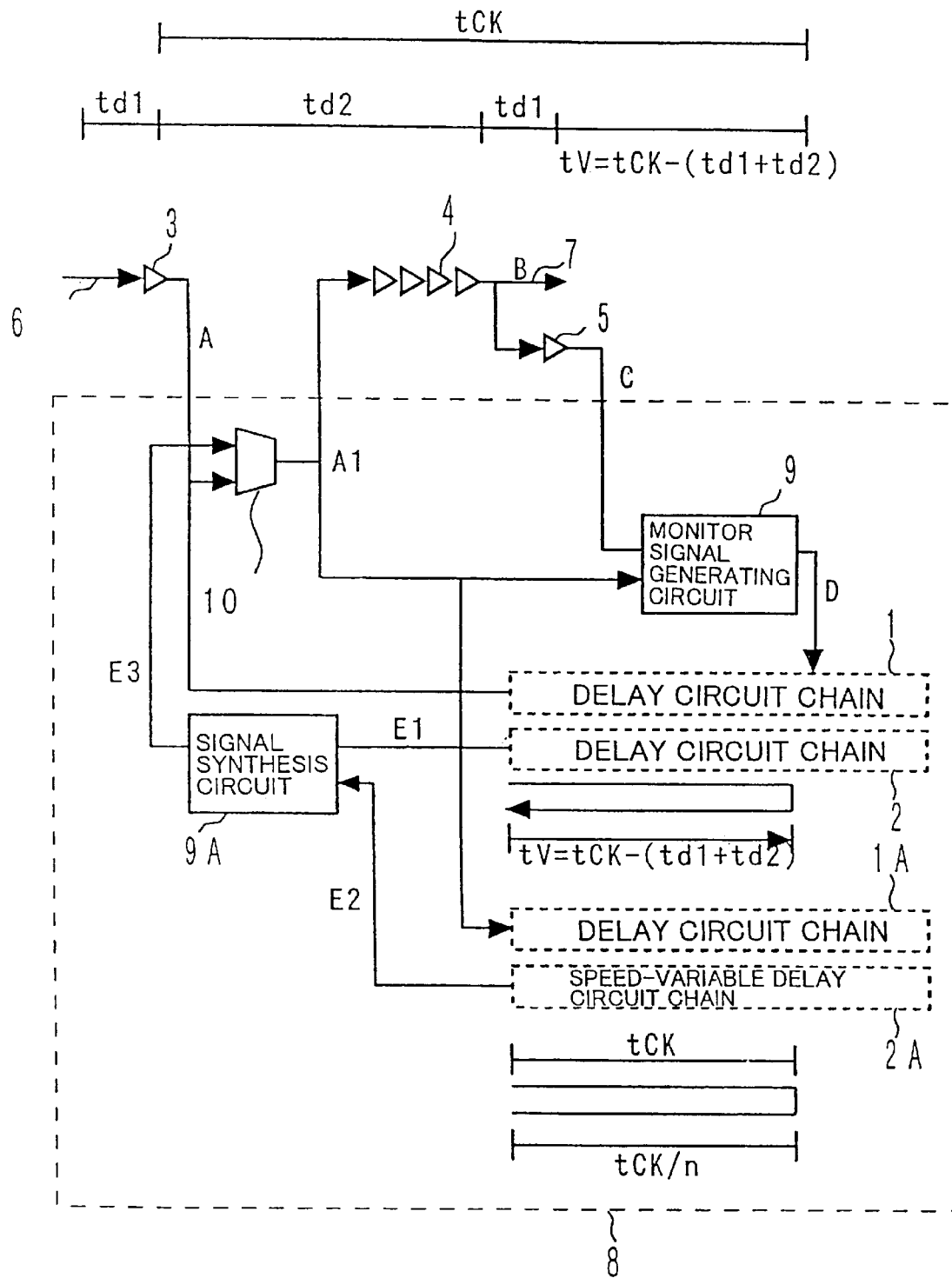
FIG. 33 shows yet another typical structure of the delay circuit chain in the fourth embodiment of the present invention.

A ninth example of the present invention is hereinafter explained. In the preset example, configured similarly to the above-described eighth embodiment, is decreased in the number of changeover circuits. FIG. 33 shows the structure of the ninth embodiment. Referring to FIG. 33, the second switch 10B (changeover unit) of FIG. 27 is omitted and an output of the first switch (changeover unit) 10B is sent to the clock driver 4, monitor signal generating circuit 9 and to the delay circuit chain 1A. Outputs of the delay circuit chain 2 and the delay circuit chain 2A (having the delay time equal to 1/n of the delay circuit chain 1A for measurement) are synthesized by a signal synthesis circuit 9A, with the synthesized signal being supplied from the first switch 10 via clock driver 4 as the internal clock. In this configuration, the switch 10 first selects the external clocks from the input buffer 3 to send the internal clock signals 7 from the clock driver 4. Outputs of the input buffer 3 are sent to the delay circuit chains 1, 2 and to the delay circuit chains 1A, 2A. After synchronization, an output of the signal synthesis circuit 9A is selected.

Although the delay circuit chains 1, 2, 1A and 2A are shown linearly, these may also be arranged in a circular ring, as disclosed in JP Patent Kokai JP-A-8-237091, with the clock signals being rotated and the number of times of rotation thereof being then counted by a counter. In this case, any of the delay circuits shown in examples 1 to 4 may be used.

Thus, in accordance with the present invention as described above, the period of a clock is measured as the propagation time of a clock pulse or clock pulse edge, the amount of delay of a clock driver is measured by ending the propagation of a clock pulse, and a time obtained by excluding the amount of delay of the clock driver from the clock period is measured. As a result, a dummy delay circuit for the clock driver is no longer necessary.

Consequently, even if the present invention is applied to a device such as an ASIC in which the amount of clock delay differs from chip to chip, it is no longer necessary to design a clock driver dummy whenever a wiring design is changed and no longer necessary to give consideration to the layout of an area for the clock driver dummy, thereby making possible highly efficient, economical design.

Further, since a time obtained by excluding the actual clock driver delay from the clock period is measured directly, there is no longer any skew caused by a difference between the amount of delay of the clock driver dummy and the amount of delay of the original clock driver even if the delay time of driver varies owing to a variation in the temperature of the device during use. This has the effect of improving accuracy and reliability by a wide margin.

As many apparently widely different embodiments of the present invention can be made without departing from the spirit and scope thereof, it is to be understood that the invention is not limited to the specific embodiments thereof except as defined in the appended claims.

What is claimed is:

1. A synchronous delay circuit for controlling a clock signal, comprising:

a first delay circuit chain propagating a pulse or pulse edge therethrough for a fixed period of time;

a second delay circuit chain passing said pulse or pulse edge over a length proportional to the length of said first delay circuit chain along a path that said pulse or pulse edge propagated, and a circuit outputting a monitor signal for a period of time that a clock pulse is propagating through a clock driver, wherein said circuit outputting is connected to said first delay circuit chain, wherein said pulse or pulse edge ceases in said first delay circuit chain during output of said monitor signal.

2. The delay circuit according to claim 1, wherein said first delay circuit chain comprises clocked inverters controlled by said monitor signal.

3. A semiconductor integrated circuit device including a synchronous delay circuit controlling a clock signal, said synchronous delay circuit comprising:

a first delay circuit chain propagating a pulse or pulse edge therethrough for a fixed period of time to produce a propagated clock signal;

a second delay circuit chain, to which said clock signal from said first delay circuit chain as an input, passing said input clock signal over a length proportional to the length of said first delay circuit chain along a path that said clock signal propagated; and a monitor signal generating circuit outputting a monitor signal for a period of time that a received clock signal is propagating through a clock driver that outputs an internal clock signal, wherein said monitor signal generating circuit is connected to said first delay circuit chain, wherein said propagated clock signal ceases in said first delay circuit chain during the output of the monitor signal.

4. The device according to claim 3, wherein said first delay circuit chain comprises clocked inverters controlled by said monitor signal.

5. The device according to claim 3 or 4, further comprising a switch supplying the output to said clock driver, and switching between an output of an input buffer, to which an external clock signal is applied as input, and an output of said second delay circuit chain.

6. The device according to claim 3, wherein said monitor generating circuit comprises a flip-flop reset and a flip-flop set through an input and an output of said clock driver respectively.

7. A semiconductor integrated circuit device including a synchronous delay circuit macro controlling a clock signal, said synchronous delay circuit macro comprising:

a first delay circuit chain propagating a pulse or pulse edge therethrough for a fixed period of time to produce a propagated clock signal;

a second delay circuit chain, to which said clock signal from said first delay circuit chain as an input, capable of passing said input clock signal over a length proportional to the length of said first delay circuit chain along a path that said clock signal propagated, a monitor signal generating circuit outputting a monitor signal for a period of time that a received clock signal is propagating through a clock driver that outputs an internal clock signal, wherein said monitor signal generating circuit is connected to said first delay circuit chain; and a switch switching between an output of an input buffer and an output of said second delay circuit chain, wherein said propagated clock signal ceases in said first delay circuit chain during the output of said monitor signal.

8. The device according to claim 7, wherein signal propagation directions of said first delay circuit chain and said second delay circuit chain are arranged in opposing directions, and a clock pulse propagates through said first delay circuit chain and then enters said second delay circuit chain through a control circuit when the next clock pulse is output by said input buffer.

9. The device according to claim 7, wherein signal propagation directions of said first delay circuit chain and said second delay circuit chain are arranged in opposing directions, and a clock signal propagates through said first delay circuit chain and then enters said second delay circuit chain when the next clock pulse is output by said input buffer.

10. The device according to claim 7, wherein signal propagation directions of said first delay circuit chain and said second delay circuit chain are arranged in the same direction, a clock signal propagates through said first delay circuit chain, and the output of said second delay circuit chain is selected when the next clock pulse is output by said input buffer.

11. The device according to claim 7, wherein signal propagation directions of said first delay circuit chain and said second delay circuit chain are arranged in opposing directions, a clock signal propagates through said first delay circuit chain, and the output of said second delay circuit chain is selected when the next clock pulse is output by said input buffer.

12. The semiconductor integrated circuit as defined in claim 7, wherein said switch switches between an output of said input buffer and an output of said second delay circuit that supplies a selected output to said clock driver, and between the output of said input buffer that receives clock signals externally and said output of said second delay circuit after first outputting said monitor signal from said monitor signal generating circuit.

13. The semiconductor integrated circuit as defined in claim 7, said switch switches between an output of said input buffer that receives clock signals externally and said output of said second delay circuit supplying the selected output to said clock driver, wherein during circuit operation, said external clock signals travel through a path from said input buffer through said switch to said clock driver, an output of said clock driver is supplied once as internal clocks and subsequently said path from the input buffer to the clock driver is switched to said path from said input buffer to said first delay circuit chain, and an output of said second delay circuit chain is selected by said switch to be supplied as internal clock signals through said clock driver.

14. The semiconductor integrated circuit as defined in claim 7, wherein said controlling is performed to stop the next monitor signal after first outputting said monitor signal.

15. The semiconductor integrated circuit as defined in claim 7, further comprising an input buffer dummy circuit having a delay time equal to that of said input buffer receiving external clocks, and connected in series with said clock driver, wherein said monitor signal generating circuit outputs monitor signals during a period of time when said clock signals are propagating through said clock driver and said input buffer.

16. The semiconductor integrated circuit as defined in claim 15, further comprising a second switch switching between an output of said input buffer dummy circuit and an output of said input buffer, wherein an output of said second switch is supplied to said first delay circuit chain, and supplying an output of said input buffer as a first clock pulse or a pulse edge entering said first delay circuit chain.

17. A synchronous delay circuit for controlling clock signals, comprising:

a first delay circuit chain allowing input clock signals to travel for a pre-set period of time;

a second delay circuit chain receiving clock signal from said first delay circuit chain, wherein said second delay circuit chain allows said input clock signals to pass therethrough by a length proportional to the length of a path of said first delay circuit chain through which the clock signals travel;

a monitor signal generating circuit outputting a monitor signal during a period of time said input clock signals are traveling through a clock driver outputting internal clock signals and through an input buffer dummy circuit connected to said clock driver, wherein said monitor signal generating circuit is connected to said first delay circuit chain;

a first switch switching between an output of said input buffer that receives clock signals externally and said output of said second delay circuit chain supplying the selected output to said clock driver; and a second switch switching between an output of said input buffer dummy circuit and an output of said input buffer supplying the selected output to said first delay circuit chain, wherein said clock signals cease in said first delay circuit chain during output of said monitor signal, wherein during circuit operation, external clock signals travel through a path from said input buffer through said first switch to said clock driver, an output of said clock driver is supplied once as internal clocks and subsequent external clock signals travel through a path from said input buffer to said clock driver, and the time corresponding to a balance of a sum (td1+td2) of a delay time (td1) of said input buffer and a delay time (td2) of said clock driver subtracted from a clock period tCK is measured by passage of said clock signals propagating through said input buffer dummy circuit and subsequently from sad second switch to said first delay circuit chain, and wherein a next clock signal, said travel path is switched from a path via said input buffer and said second switch, through said first delay circuit chain measuring reproduction and the second delay circuit chain delaying reproduction, to a path via said first switch and said clock driver removing skew of said external clocks and said internal clocks.

18. The semiconductor integrated circuit as defined in any one of claims 3, 7 or 17, further comprising:

a third delay circuit chain allowing pulses or pulse edges to travel for a pre-set time; and a fourth delay circuit chain allowing said pulses or pulse edges to travel therethrough by a length proportionate to said length through which said pulses or pulse edges have traveled in said third delay circuit chain, wherein said clock signals cease for a period of time after being allowed to travel through said third delay circuit chain.

19. The semiconductor integrated circuit as defined in claim 18, further comprising a third switch switching between an output of said input buffer which receives external clocks and an output of said second delay circuit chain, wherein an output of the third switch is supplied to said third delay circuit chain.

20. A synchronous delay circuit for controlling clock signals, comprising:

a first delay circuit chain allowing input clock signals output from an input buffer to travel for a pre-set period of time;

a second delay circuit chain receiving clock signals from said first delay circuit chain and allowing said input clock signals to pass therethrough by a length corresponding to the length of said first delay circuit chain through which said clock signals traveled;

a monitor signal generating circuit outputting a monitor signal during a period of time said input clock signals are traveling through a clock driver outputting internal clock signals and through an input buffer dummy circuit connected to said clock driver, wherein said monitor signal generating circuit is connected to said first delay circuit chain;

a third delay circuit chain allowing pulses or pulse edges to travel therethrough for a pre-set period of time;

a variable-speed fourth delay circuit chain allowing said pulses or pulse edges to travel therethrough by a length proportionate to the length through which said pulses or pulse edges have traveled in said third delay circuit chain;

a signal synthesis circuit synthesizing an output of said second delay circuit chain and an output of said variable-speed fourth delay circuit chain;

a first switch receiving inputs of an output of said signal synthesis circuit and an output of said input buffer, wherein said first switch outputs one of the outputs to said clock driver and said monitor signal generating circuit; and a second switch receiving an output of said input buffer and an output of said second delay circuit chain as input, wherein said second switch outputs one of the outputs to an input of said third delay circuit chain.

21. A synchronous delay circuit for controlling clock signals, comprising:

a first delay circuit chain allowing input clock signals sent from the input buffer to travel for a pre-set period of time;

a second delay circuit chain receiving clock signals from said first delay circuit chain, wherein said second delay circuit chain allows said input clock signals to pass therethrough by a length proportionate to the length of said first delay circuit chain through which the clock signals traveled;

a monitor signal generating circuit outputting a monitor signal during a period of time said input clock signals are traveling through a clock driver outputting internal clock signals and through an input buffer dummy circuit connected to said clock driver, wherein said monitor signal generating circuit is connected to said first delay circuit chain;

a third delay circuit chain allowing pulses or pulse edges to travel therethrough for a pre-set period of time;

a variable-speed fourth delay circuit chain allowing said pulses or pulse edges to travel therethrough by a length proportionate to the length through which said pulses or pulse edges traveled in said third delay circuit chain;

a signal synthesis circuit synthesizing an output of said second delay circuit chain and an output of said variable-speed fourth delay circuit chain; and a switch receiving an output of said signal synthesis circuit and an output of said input buffer, wherein said switch outputs one of the outputs to said clock driver, said monitor signal generating circuit and said third delay circuit chain.

22. The semiconductor integrated circuit as defined in claim 18, wherein third delay circuit chain elements and fourth delay circuit chain elements are provided at a mutually different element number ratio.

23. The semiconductor integrated circuit as defined in claim 20 or 21, wherein third delay circuit chain elements and fourth delay circuit chain elements are provided at a mutually different element number ratio.

24. The semiconductor integrated circuit as defined in claims 18, wherein third delay circuit chain elements and fourth delay circuit chain elements are provided at a mutually different load ratio.

25. The semiconductor integrated circuit as defined in claims 20 or 21, wherein third delay circuit chain elements and fourth delay circuit chain elements are provided at a mutually different load ratio.

26. The semiconductor integrated circuit as defined in claim 18, wherein third delay circuit chain elements and fourth delay circuit chain elements are provided at a mutually different driving capability ratio.

27. The semiconductor integrated circuit as defined in claim 20 or 21, wherein third delay circuit chain elements and fourth delay circuit chain elements are provided at a mutually different driving capability ratio.

28. The semiconductor integrated circuit as defined in claim 18, wherein said first, second, third and fourth delay circuit chains are made up of delay circuits separately driving PMOS and NMOS transistors comprising delay circuits of said first, second, third and fourth delay circuit chains.

29. The semiconductor integrated circuit as defined in claim 20 or 21, wherein said first, second, third and fourth delay circuit chains are made up of delay circuits separately driving PMOS and NMOS transistors comprising delay circuits of said first, second, third and fourth delay circuit chains.

30. The semiconductor integrated circuit as defined in claim 18, wherein said clock signal entering said first, second, third and fourth delay circuit chain is divided alternately by PMOS transistors and NMOS transistors in series.

31. The semiconductor integrated circuit as defined in claim 20 or 21, wherein said clock signal entering said first, second, third and fourth delay circuit chain is divided alternately by PMOS transistors and NMOS transistors in series.

32. The semiconductor integrated circuit as defined in any one of claims 3, 7, 17, 20 or 21, wherein said clock pulses or clock edges received externally are complementary clock signals, and rising or falling edges of said complementary clock signals are alternately utilized.

33. The semiconductor integrated circuit as defined in any one of claims 3, 7, 17, 20 or 21, wherein said clock pulses or clock edges received externally are complementary clock signals, and two sets of circuits reciprocally utilizing one of rising or falling edges of said complementary clock signals are provided.

34. The semiconductor integrated circuit as defined in any one of claims 3, 17, 17 or 21, wherein at least one of said delay circuit chains is configured so that delay elements are arrayed in a circular ring, clock signals are rotated, and the number of times of rotation is counted by a counter.

* * * * *